US010483475B2

(12) United States Patent
Kurasawa et al.

(10) Patent No.: US 10,483,475 B2
(45) Date of Patent: Nov. 19, 2019

(54) DISPLAY DEVICE

(71) Applicant: Japan Display Inc., Tokyo (JP)

(72) Inventors: Hayato Kurasawa, Tokyo (JP);
Mitsuhide Miyamoto, Tokyo (JP);
Hiroshi Mizuhashi, Tokyo (JP);
Takayuki Nakanishi, Tokyo (JP); Shuji Hayashi, Tokyo (JP); Yoshitoshi Kida,
Tokyo (JP)

(73) Assignee: Japan Display Inc., Tokyo (JP)

( * ) Notice: Subject to any disclaimer, the term of this patent is extended or adjusted under 35 U.S.C. 154(b) by 128 days.

(21) Appl. No.: 15/626,286

(22) Filed: Jun. 19, 2017

(65) Prior Publication Data

US 2018/0019432 A1 Jan. 18, 2018

(30) Foreign Application Priority Data

Jul. 12, 2016 (JP) .................................. 2016-137350

(51) Int. Cl.
*H01L 51/50* (2006.01)
*G02F 1/1362* (2006.01)
(Continued)

(52) U.S. Cl.
CPC .... *H01L 51/5012* (2013.01); *G02F 1/136227* (2013.01); *H01L 51/5068* (2013.01); *G02F 1/0316* (2013.01); *G02F 1/133305* (2013.01)

(58) Field of Classification Search
CPC ............ G02F 1/0316; G02F 1/133305; G02F 1/136227; H01L 51/5012; H01L 51/5068
See application file for complete search history.

(56) References Cited

U.S. PATENT DOCUMENTS 8,599,146 B2 * 12/2013 Utsunomiya ........... G06F 3/044
345/173
8,643,796 B2 * 2/2014 Kimura ............. G02F 1/133707
345/156
(Continued)

FOREIGN PATENT DOCUMENTS

JP 2008-216543 A 9/2008
JP 2011-227369 A 11/2011
(Continued)

OTHER PUBLICATIONS

Korean Office Action dated Dec. 17, 2018 for the corresponding Korean application No. 10-2017-0075773 with partial English translation.
(Continued)

*Primary Examiner* — Kenneth Bukowski
(74) *Attorney, Agent, or Firm* — Michael Best & Friedrich LLP

(57) ABSTRACT

A display device includes a plurality of sub pixels; a plurality of first electrodes, the sub pixel having the plurality of first electrodes; a plurality of second electrodes, the second electrode being provided commonly for at least one row pixel group, the row pixel group including sub pixels arrayed in a line in a first direction among the plurality of sub pixels, the plurality of second electrodes being arrayed in a second direction crossing the first direction; a light emitting layer between the first electrode and the second electrode, the sub pixel having the light emitting layer; and a plurality of third electrodes facing the second electrodes, the third electrodes and the second electrodes forming capacitances, the third electrodes being connected with a plurality of output terminals respectively.

8 Claims, 24 Drawing Sheets

(51) Int. Cl.
*G02F 1/03* (2006.01)
*G02F 1/1333* (2006.01)

(56) References Cited

U.S. PATENT DOCUMENTS

| | | | | |
|---|---|---|---|---|
| 9,910,325 | B2* | 3/2018 | Seki | G02F 1/13338 |
| 9,977,274 | B2* | 5/2018 | Shin | G06F 3/041 |
| 10,078,239 | B2* | 9/2018 | Sugita | G02F 1/1333 |
| 2008/0211395 | A1 | 9/2008 | Koshihara et al. | |
| 2011/0260180 | A1* | 10/2011 | Kuranaga | G02F 1/133351 257/88 |
| 2012/0050193 | A1* | 3/2012 | Noguchi | G02F 1/13338 345/173 |
| 2012/0218199 | A1* | 8/2012 | Kim | G06F 3/0412 345/173 |
| 2012/0249401 | A1 | 10/2012 | Omoto | |
| 2012/0319961 | A1 | 12/2012 | Liu | |
| 2013/0314372 | A1 | 11/2013 | Chang et al. | |
| 2014/0111404 | A1* | 4/2014 | Omata | H05B 33/08 345/76 |
| 2015/0185942 | A1 | 7/2015 | Kim et al. | |
| 2016/0306479 | A1 | 10/2016 | Zhu et al. | |
| 2016/0313837 | A1 | 10/2016 | Zhu et al. | |
| 2017/0060317 | A1* | 3/2017 | Kim | G06F 3/0416 |

FOREIGN PATENT DOCUMENTS

| | | |
|---|---|---|
| JP | 2012-208263 A | 10/2012 |
| KR | 10-2012-0019366 A | 3/2012 |
| KR | 10-2013-0056497 A | 5/2013 |
| KR | 10-2014-0050559 A | 4/2014 |
| WO | 2015/085900 A1 | 6/2015 |
| WO | 2015/096764 A1 | 7/2015 |

OTHER PUBLICATIONS

Korean Office Action dated Jun. 28, 2019 for the corresponding Korean application No. 10-2017-0075773, with partial English translation.

Korean Notice of Allowance dated Sep. 3, 2019 for the corresponding Korean application No. 10-2017-0075773, with partial English machine translation.

* cited by examiner

DISPLAY DEVICE

CROSS REFERENCE TO RELATED APPLICATIONS

This application is based upon and claims the benefit of priority from the prior Japanese Patent Application No. 2016-137350 filed on Jul. 12, 2016, the entire contents of which are incorporated herein by reference.

FIELD

An embodiment of the present invention relates to a display device such as an organic EL display device, for example, a display device including a touch sensor.

BACKGROUND

A touch sensor is known as an interface allowing a user to input information to a display device. The touch sensor is set on a screen of the display device, so that the user may operate an input button, an icon or the like displayed on the screen to easily input information to the display device. For example, United States Patent Application Publication No. 2015/0185942 discloses an electronic device including a touch sensor provided in an organic EL (electroluminescence) display device.

A conventional display device including a touch sensor described in United States Patent Application Publication No. 2015/0185942 requires an electrode for the touch sensor to be provided in addition to a conductive layer included in the display device. Especially, in the case where an electrostatic capacitance-type touch sensor is used, a pair of electrodes need to be additionally provided in the display device in order to form a capacitance element that detects the touch of the user. Therefore, in order to incorporate a touch sensor in the display device, at least two conductive layers need to be provided in addition to the conductive layer conventionally provided in the display device.

SUMMARY

A display device in an embodiment according to the present invention includes a plurality of sub pixels; a plurality of first electrodes, the sub pixel having the plurality of first electrodes; a plurality of second electrodes, the second electrode being provided commonly for at least one row pixel group, the row pixel group including sub pixels arrayed in a line in a first direction among the plurality of sub pixels, the plurality of second electrodes being arrayed in a second direction crossing the first direction; a light emitting layer between the first electrode and the second electrode, the sub pixel having the light emitting layer; and a plurality of third electrodes facing the second electrodes, the third electrodes and the second electrodes forming capacitances, the third electrodes being connected with a plurality of output terminals respectively.

DESCRIPTION OF EMBODIMENTS

Figure 1:
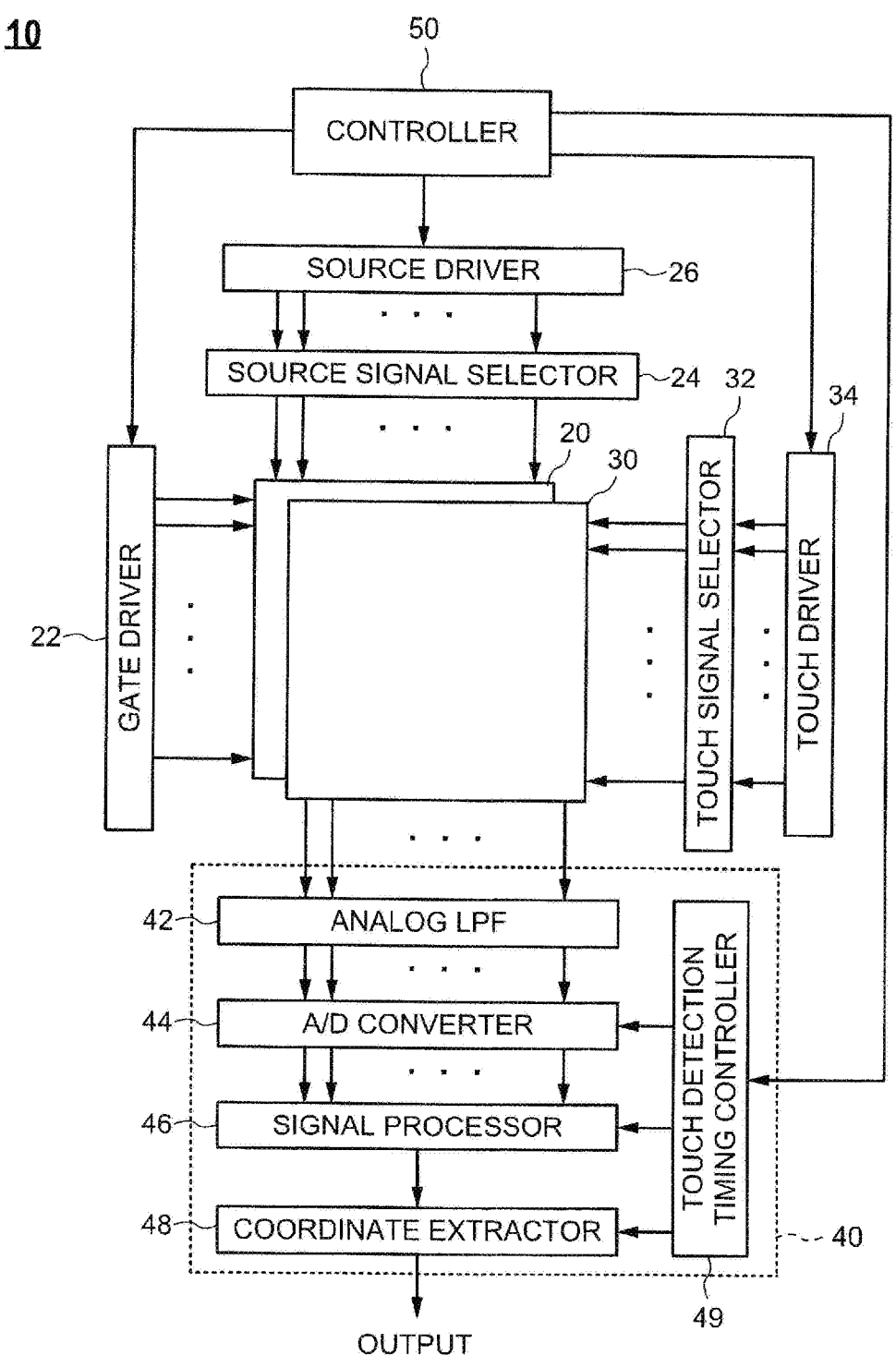
FIG. 1 is a functional block diagram showing an overview of a display device in an embodiment according to the present invention.

Hereinafter, embodiments of the present invention will be described with reference to the drawings. The disclosure merely provides examples, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings merely show examples and do not limit the interpretations of the present invention in any way. In the specification and the drawings, components that are substantially the same as those shown in a previous drawing(s) bear the identical reference signs thereto, and detailed descriptions thereof may be omitted. The following embodiments have an object of providing a display device including a touch sensor that has a novel electrode structure and is drivable by a novel method.

According to the present invention, in the case where one film is processed to form a plurality of films, such a plurality of films may have different functions or roles. However, such a plurality of films are derived from one film, are formed by the same formation step, have the same layer structure, and are formed of the same material. Thus, such a plurality of films are defined as being present in the same layer.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified.

Embodiment 1

With reference to FIG. 1 through FIG. 9, an overview of a display device in an embodiment according to the present invention will be described. In embodiment 1, an organic EL display device 10 including a touch sensor will be described. The following embodiment is merely an example of the present invention.

[Functional Structure of the Display Device 10]

FIG. 1 is a functional block diagram showing an overview of the display device 10 in an embodiment according to the present invention. The display device 10 includes a display portion 20, a touch sensing portion 30, a touch detector 40, and a controller 50.

The display portion 20 is connected with, and controlled by, a gate driver 22, a source signal selector 24, and a source driver 26. Specifically, the display portion 20 includes a plurality of pixel circuits arrayed in a matrix, namely, in a plurality of rows by a plurality of columns. Each of the pixel circuits is controlled by the gate driver 22, the source signal selector 24, and the source driver 26. A single-color pixel provided to realize a full-color display will be referred to as a "sub pixel". A minimum unit of sub pixels that realizes a full-color display or a white display will be referred to as a "main pixel". Hereinafter, a circuit provided in each sub pixel will be described as a pixel circuit.

The gate driver 22 is a driving circuit that selects a row of sub pixels to which a video signal is to be written. As described below, each pixel circuit includes a plurality of transistors. The gate driver 22 controls the plurality of transistors to be on or off. The gate driver 22 selects the transistors included in the pixel circuits in each row exclusively and sequentially in a predetermined order. The gate driver 22 selects a row of sub pixels to which a video signal input by the soured signal selector 24 and the source driver 26 is to be supplied, and thus supplies a video signal to a driving transistor (one of the plurality of transistors) included in each of the pixel circuits in each row.

The source signal selector 24 selects a column of sub pixels to which a video signal is to be supplied in accordance with a control signal generated by the source driver 26. The source signal selector 24 includes a multiplexer circuit. The multiplexer circuit performs so-called multiplexer driving, namely, supplies a video signal to each of sub pixels, for example, a red sub pixel R, a green sub pixel G and a blue sub pixel B, sequentially. The source signal selector 24 includes the multiplexer circuit, so that the number of lines between the source driver 26 and the controller 50 is decreased.

The touch sensing portion 30 is connected with, and controlled by, a touch signal selector 32 and a touch driver 34. Specifically, the touch sensing portion 30 includes a plurality of touch sensor driving electrodes (corresponding to "second electrodes 120" described below). Each of the touch sensor driving electrodes is controlled by the touch signal selector 32 and the touch driver 34.

Each touch sensor driving electrode is commonly provided for a plurality of sub pixels. In this embodiment, each touch sensor driving electrode is commonly provided for a plurality of sub pixels arrayed in one row in the row direction (hereinafter, such sub pixels will be collectively referred to as a "row pixel group"). In other words, each touch sensor driving electrode is commonly provided for at least one row pixel group. The plurality of touch sensor driving electrodes are arrayed in a plurality of columns, namely, in a plurality of blocks. In this embodiment, two row pixel groups are located in correspondence with one block of touch sensor driving electrode. Alternatively, one row pixel group may be located in correspondence with one block of touch sensor driving electrode, or three or more row pixel groups may be located in correspondence with one block of touch sensor driving electrode. In this embodiment, each touch sensor driving electrode is located in correspondence with at least one row pixel group. The present invention is not limited to this. For example, each touch sensor driving electrode may be located in correspondence with sub pixels in i rows by j columns, and such touch sensor driving electrodes may be arrayed in a matrix (i and j are each an arbitrary integer).

As can be seen from the above, each touch sensor driving electrode has a width corresponding to an integral multiple of the size of each sub pixel in the column direction. Each touch sensor driving electrode extends in the row direction. The number of the touch sensor driving electrodes do not necessarily match the number of the row pixel groups. In order to clearly distinguish the touch sensor driving electrode and the row pixel groups from each other, the number of touch sensor driving electrodes may be counted by "blocks". The number of row pixel groups will be counted by "rows".

The touch driver 34 is a driving circuit that selects a block at which the touch sensor is to be driven. The touch driver 34 selects the plurality of blocks of touch sensor driving electrodes exclusively and sequentially in a predetermined order. The touch signal selector 32 selects a block of touch sensor driving electrode to which a touch sensor driving signal is to be supplied in accordance with a control signal generated by the touch driver 34. The touch signal selector 32 includes a multiplexer circuit. The multiplexer circuit performs multiplexer driving like the source signal selector

24. The touch signal selector 32 includes the multiplexer circuit, so that the number of lines between the touch driver 34 and the controller 50 is decreased.

The touch detector 40 is connected with the touch sensing portion 30. The touch detector 40 receives a touch detection signal output from the touch sensing portion 30. The touch detection signal indicates a contact or approach of a detected item on or to the touch sensing portion 30 (hereinafter, such a contact or approach will be referred to as a "touch"). Specifically, the touch sensing portion 30 includes a plurality of touch detection electrodes (corresponding to "third electrodes 180" described below). The touch detector 40 receives a touch detection signal via each of the touch detection electrodes. The touch detector 40 includes an analog LPF (Low Pass Filter) 42, an A/D (analog/digital) converter 44, a signal processor 46, a coordinate extractor 38, and a touch detection timing controller 49. The detected item may be a finger, a hand or the like of the user using the display device 10, or alternatively, a stylus or the like.

The touch detector 40 detects whether or not there is a touch on the touch sensing portion 30 based on a control signal supplied from the controller 50 and a touch detection signal supplied from the touch sensing portion 30. When a touch on the touch sensing portion 30 is detected, the touch detector 40 calculates a coordinate position at which the touch has been detected. Among the plurality of detection electrodes, every two touch detection electrodes adjacent to each other are separated from each other. Namely, the plurality of touch detection electrodes are electrically independent from each other. The plurality of touch detection electrodes are connected with a plurality of output terminals respectively.

The analog LPF 42 is an analog low pass filter that removes a high frequency component (noise component) included in the touch detection signal received from the touch sensing portion 30, and extracts and outputs a touch component based on the touch detection. Although not shown, a resistance element is provided between an input terminal of the analog LPF 42 and the ground GND. The A/D converter 44 is a circuit that samples an analog signal output from the analog LPF 42 in synchronization with the touch sensor driving signal output via the touch signal selector 32 and converts the analog signal into a digital signal.

The signal processor 46 includes a digital filter. The digital filter removes noise of the output signal from the A/D converter 44 and extracts the touch component. Specifically, the signal processor 46 removes a high frequency component that is higher than the frequency of the touch sensor driving signal sampled by the touch signal selector 32. The signal processor 46 is a logic circuit that determines whether or not a touch on the touch sensing portion 30 has been detected based on the output signal from the A/D converter 44. The coordinate extractor 48 is a logic circuit that calculates a coordinate position at which the touch has been detected when the signal processor 46 determines that a touch on the touch sensing portion 30 has been detected. The coordinate extractor 48 outputs the calculated coordinate position as the output signal. The touch detection timing controller 49 performs control such that the A/D converter 44, the signal processor 46 and the coordinate extractor 48 are operated in synchronization with each other.

[Structure of the Touch Sensor Driving Electrode in the Touch Sensing Portion 30]

Figure 2:
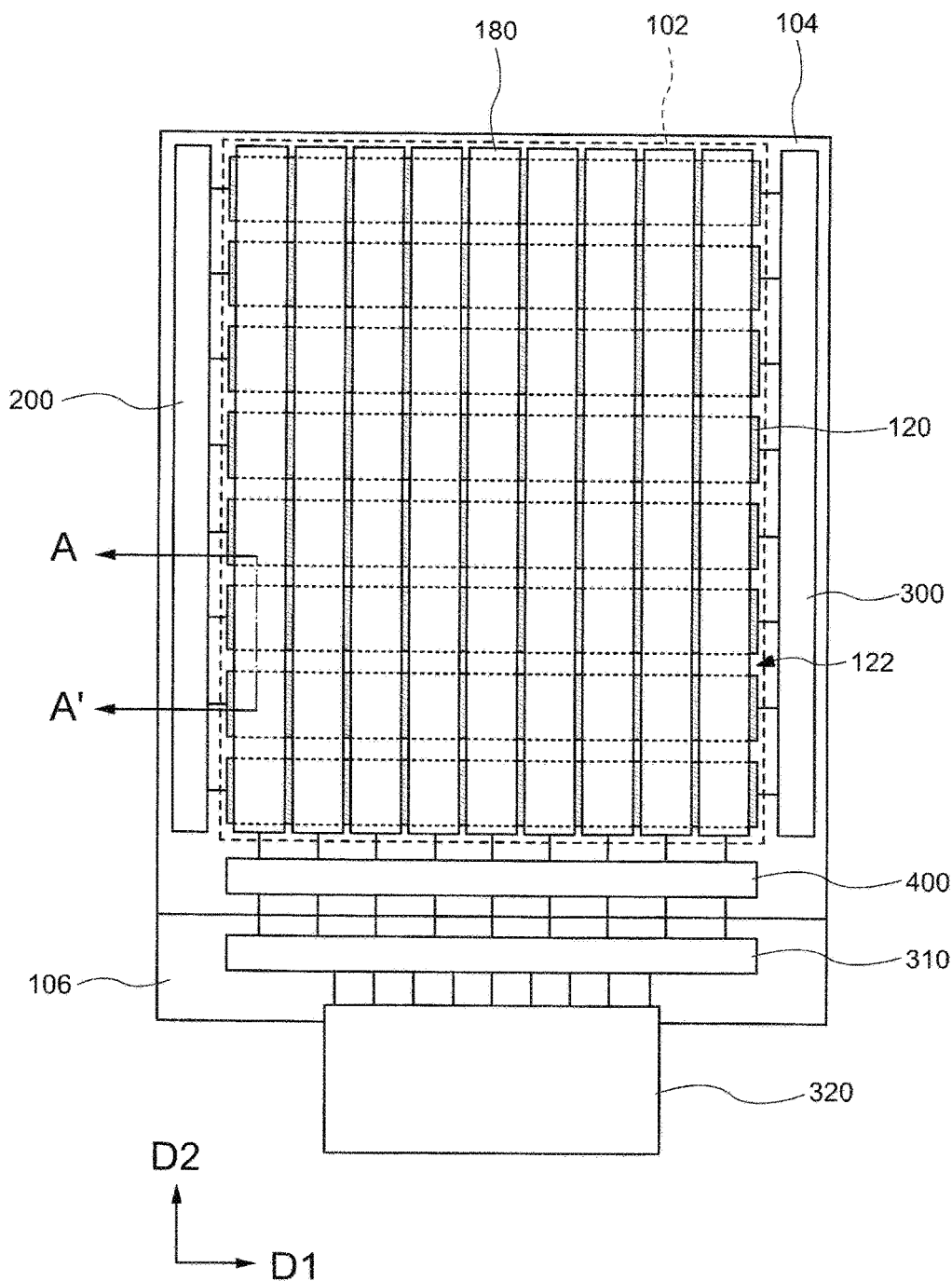
FIG. 2 is a plan view showing the positional relationship between second electrodes and third electrodes in the display device in an embodiment according to the present invention.
Figure 3:
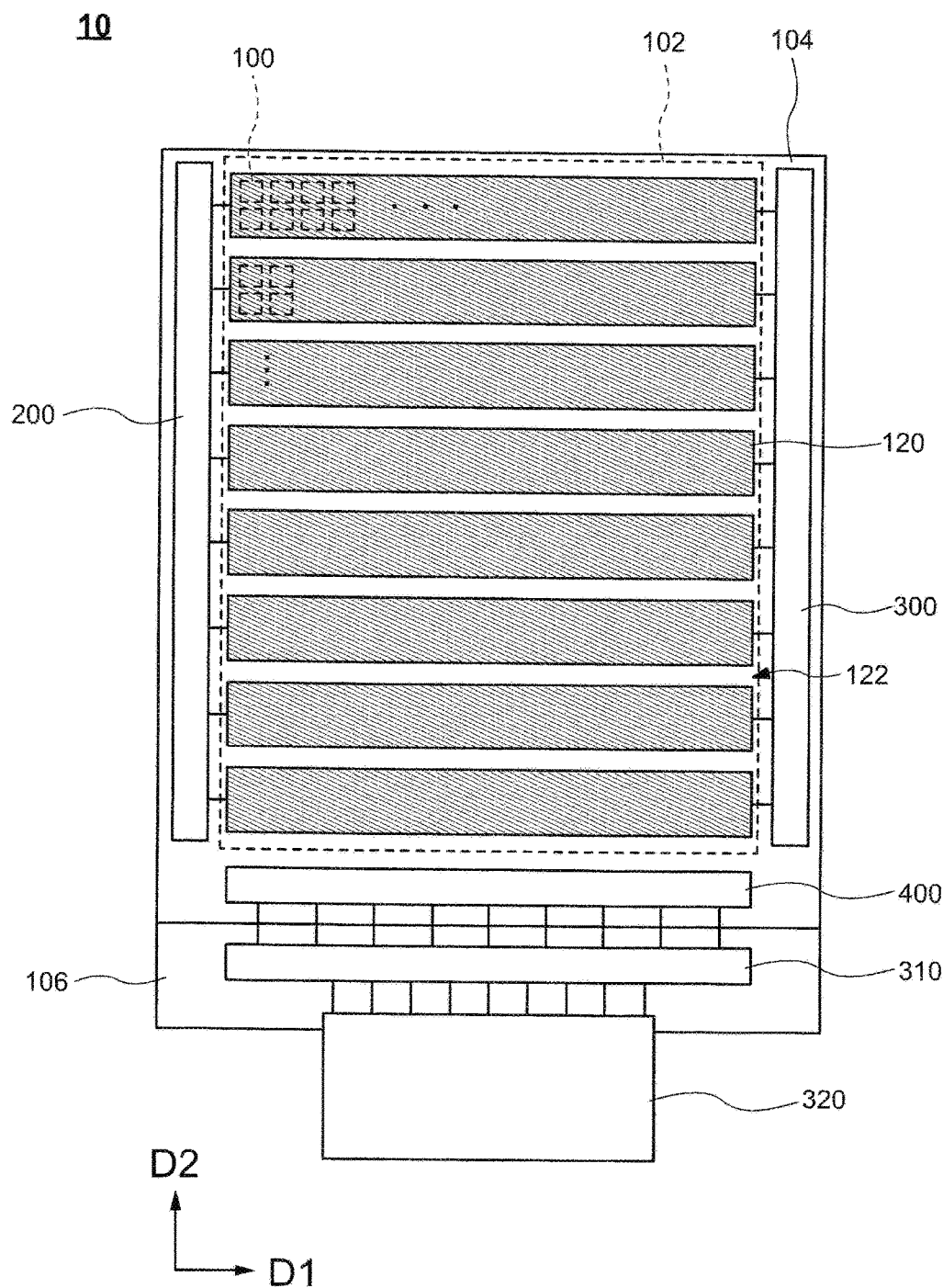
FIG. 3 is a plan view showing the positional relationship between the second electrodes and sub pixels in the display device in an embodiment according to the present invention.

With reference to FIG. 2 and FIG. 3, a structure of the touch sensor driving electrodes (second electrodes 120) in the touch sensing portion 30 and a structure of the touch detection electrodes (third electrodes 180) in the touch detector 40 will be described. FIG. 2 is a plan view showing the positional relationship between the second electrodes 120 and the third electrodes 180 in the display device 10 in an embodiment according to the present invention. FIG. 3 is a plan view showing the positional relationship between the second electrodes 120 and the sub pixels in the display device 10 in an embodiment according to the present invention. The display device 10 includes a display region 102, a peripheral region 104, and a terminal region 106. The display region 102 includes the sub pixels displaying an image. The peripheral region 104 is a region around the display region 102. The terminal region 106 is adjacent to one end of the peripheral region 104.

In the display region 102, the plurality of sub pixels 100 are arrayed in a row-column configuration. The plurality of second electrodes 120 and the plurality of third electrodes 180 are located in correspondence with the plurality of sub pixels 100. The plurality of second electrodes 120 are longer in the row direction, and each second electrode 120 is commonly provided for a row pixel group (a plurality of sub pixels 100 arrayed in a row in the row direction). The second electrodes 120 are arrayed in the column direction. The third electrodes 180 are longer in the column direction, and each third electrode 180 is commonly provided for a plurality of sub pixels 100 arrayed in a column in the column direction. The third electrodes 180 are arrayed in the row direction. In FIG. 3, the interval between the first row of sub pixels 100 and the second row of sub pixels 100 is shown to be larger than the interval between the second row of sub pixels 100 and the third row of sub pixels 100 for the sake of convenience. In actuality, the interval between the first row of sub pixels 100 and the second row of sub pixels 100 is the same as the interval between the second row of sub pixels 100 and the third row of sub pixels 100.

As shown in FIG. 3, the plurality of sub pixels 100 are covered with the second electrodes 120. Specifically, each second electrode 120 is commonly provided for a plurality of sub pixels 100. More specifically, each second electrode 120 extending in the row direction (first direction D1) of the display region 102 is commonly provided for a plurality of sub pixels 100 arrayed in the first direction D1 and also for a plurality of sub pixels 100 arrayed in a second direction D2 crossing the first direction D1 (e.g., in the column direction). In FIG. 3, each second electrode 120 covers two rows of sub pixels 100 arrayed in the second direction D2. In other words, each of the plurality of second electrodes 120 is commonly provided for a plurality of row pixel groups adjacent to each other in the second direction D2.

Every two second electrodes 120 adjacent to each other are separated from each other. In other words, a slit 122 is provided between every two second electrodes 120 adjacent to each other in the second direction D2. Such a structure allows the plurality of second electrodes 120 to be controlled separately electrically. In this case, the second electrodes 120 may be supplied with the same potential or different potentials at the same time. As shown in FIG. 3, the plurality of blocks of second electrodes 120 are sequentially supplied with a touch sensor driving signal. In order to remove noise of a low frequency, it is preferable to supply a touch sensor driving signal to the second electrodes 120 at a frequency of 120 Hz or higher.

In the peripheral region 104, a gate driver circuit 200, a touch driver circuit 300, and a touch detection circuit 400 are provided. The gate driver circuit 200 and the touch driver circuit 300 are located in a region adjacent to the display region 102 in the row direction. The touch detection circuit 400 is located in a region adjacent to the display region 102 in the column direction. The gate driver circuit 200 includes a plurality of the gate drivers 22. The touch driver circuit 300 includes the touch signal selector 32 and the touch driver 34. The touch detection circuit 400 includes the analog LPF 42, the A/D converter 44, the signal processor 46, the coordinate extractor 48 and the touch detection timing controller 49.

In the terminal region 106, a COG (Chip On Glass) 310 and an FPC (Flexible Printed Circuit) 320 are provided. The COG 310 includes the source signal selector 24 and the source driver 26. The COG 310 is mounted on a substrate on which the transistors are formed via a bump or the like. The COG 310 is connected with lines provided on the substrate, and supplies a signal and a power supply to various circuits via the lines. The COG 310 may have functions of a part of, or all of, the gate driver circuit 200, the touch driver circuit 300 and the touch detection circuit 400. The FPC 320 is connected with the COG 310. The FPC 320 is connected with an external device. In the example shown in FIG. 2, all the lines extending from the FPC 320 are connected with the COG 310. The present invention is not limited to this structure, and a part of the lines extending from the FPC 320 may be directly connected with the gate driver circuit 200, the touch driver circuit 300 and the touch detection circuit 400.

A video signal supplied from the external device is input to the COG 310 via the FPC 320. The COG 310 drives the gate driver circuit 200, the touch driver circuit 300 and the touch detection circuit 400. As a result of these circuits being driven, the video signal (or gray scale signal) is supplied to the sub pixels 100 located in the display region 102, and an image based on the video signal is displayed on the display region 102. In FIG. 2 and FIG. 3, the gate driver circuit 200 and the touch driver circuit 300 are located in two different regions having the display region 102 therebetween. Alternatively, the gate driver circuit 200 and the touch driver circuit 300 may be located in a region along one side of the display device 102.

The plurality of sub pixels 100 may respectively include display elements such as light emitting elements, liquid crystal elements or the like displaying different colors. With such an arrangement, a full-color display is provided. For example, display elements displaying red, green, blue and white may be respectively provided in four sub pixels 100. Alternatively, display elements displaying red, green and blue may be respectively provided in three sub pixels 100. The display elements display such colors themselves. Alternatively, the display elements may act as white light sources and provide light of such colors via color filters provided thereon. There is no limitation on the pattern of arrangement of the sub pixels 100, and the sub pixels 100 may be arranged in a stripe pattern, a delta pattern, a pentile pattern or the like.

As described below, in this embodiment, the sub pixels 100 include pixel electrodes and an EL layer provided on the pixel electrode. As shown in FIG. 2 and FIG. 3, counter electrodes (second electrodes 120) located in a stripe pattern are provided on the EL layer. Light emitting elements (represented by reference sign 160 in FIG. 4, etc.) each include the pixel electrode, the EL layer and the second electrode 120. Namely, the second electrode 120 is supplied with an anode power supply potential or a cathode power supply potential of the light emitting element.

[Cross-Sectional Structure of the Display Device 10]

Figure 4:
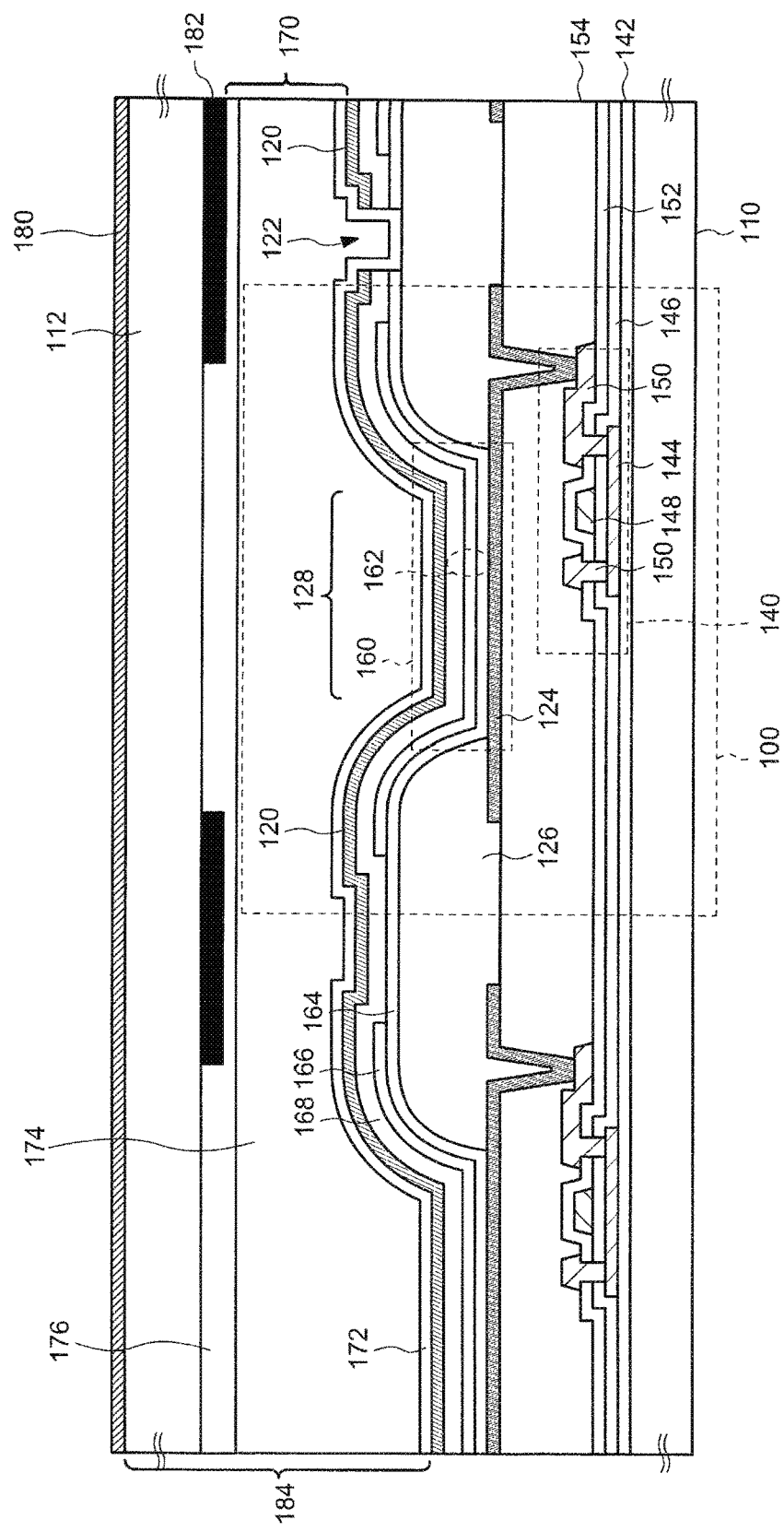
FIG. 4 is a cross-sectional view showing an overview of the display device in an embodiment according to the present invention.

FIG. 4 is a cross-sectional view showing an overview of the display device 10 in an embodiment according to the present invention. As shown in FIG. 4, the sub pixel 100 includes a transistor 140, and a light emitting element 160 connected with the transistor 140. FIG. 4 shows an example in which one transistor 140 is provided in one sub pixel 100. Alternatively, a plurality of transistors may be provided in one sub pixel 100. Still alternatively, a functional element other than the transistor, for example, a capacitance element or the like, may be provided in one sub pixel 100.

The transistor 140 includes an undercoat 142 provided on a substrate 110, a semiconductor film 144, a gate insulating film 146, a gate electrode 148, and source and drain electrodes 150. The semiconductor film 144, the gate insulating film 146, the gate electrode 148, and the source and drain electrodes 150 are provided on the undercoat 142. An interlayer insulating film 152 is provided between the gate electrode 148 and the source and drain electrodes 150. The transistor 140 is a top gate-type transistor, in which the gate electrode 148 is provided above the semiconductor film 144. There is no limitation on the structure of the transistor 140, and a bottom gate-type transistor, in which the positions of the gate electrode and the semiconductor film are exchanged with each other from those in the transistor 140, may be used. The transistor 140 has a top contact structure, in which the source and drain electrodes 150 contact a top surface of the semiconductor film 144. The positions of the semiconductor film 144 and the source and drain electrodes 150 may be exchanged with each other. A transistor having a bottom contact structure, in which the source and drain electrodes 150 contact a bottom surface of the semiconductor film 144, may be used.

A flattening film 154 is provided on the transistor 140. The flattening film 154 alleviates roughness or inclination caused by the formation of the transistor 140 or any other functional elements to provide a flat surface. The flattening film 154 has an opening formed therein. A first electrode 124 of the light emitting element 160 is electrically connected with one of the source and drain electrodes 150 via the opening. The first electrode 124 is the pixel electrode. The first electrode 124 is located in each of the plurality of sub pixels 100.

A partition wall 126 covers an end of the first electrode 124 and fills the opening used to connect the first electrode 124 and one of the source and drain electrodes 150. The partition wall 126 has an opening 128 formed therein. An EL layer 162 is provided in the opening 128 and on the partitioning wall 126. On the EL layer 162, the second electrode 120 is provided. The second electrode 120 shown in FIG. 4 is the same element as the second electrode 120 shown in FIG. 2 and FIG. 3. Every two second electrodes 120 adjacent to each other are separated from each other by the slit 122. In FIG. 4, the slit 122 is formed also in the EL layer 162. The slit 122 does not need to be formed in the EL layer 162. The EL layer 162 includes a hole transfer layer 164, a light emitting layer 166 and an electron transfer layer 168. The light emitting layer 166 contains a material corresponding to the color to be displayed by the sub pixel. In other words, the display device 10 is an EL display device in which different sub pixels provide different colors. In this specification, the "EL layer 162" refers to a layer provided between the first electrode 124 and the second electrode 120. In FIG. 4, the EL layer 162 is shown as including the hole transfer layer 164, the light emitting layer 166 and the electron transfer layer 168. There is no limitation on the number of layers included in the EL layer 162.

An insulating film 170, a light shielding layer 182, a counter substrate 112, and the third electrode 180 are provided on the second electrode 120. In FIG. 4, the insulating film 170 includes a first insulating layer 172, a second insulating layer 174 and a third insulating layer 176. The first insulating layer 172 is located on the second electrode 120. The first insulating layer 172 includes a barrier film resistant against moisture and oxygen. The third insulating layer 176 includes an overcoat film. The overcoat film alleviates roughness or inclination caused by the formation of the light shielding layer 182 on the counter substrate 112 to provide a flat surface. The second insulating layer 174 includes a filling material filling a gap between the first insulating layer 172 and the third insulating layer 176. There is no limitation on the structure of the insulating film 170. The insulating film 170 may be formed of a single layer.

The third electrode 180 is provided on the side opposite to the light shielding layer 182 and the third insulating layer 176 with respect to the counter substrate 112. In other words, the third electrode 180 is located to face the second electrode 120. At least the insulating film 170 and the counter substrate 112 are provided between the second electrode 120 and the third electrode 180. Namely, the second electrode 120 and the third electrode 180 form a capacitance having, as a dielectric element, a stack structure 184 including at least the insulating film 170 and the counter substrate 112. As shown in FIG. 2, the second electrodes 120 and the third electrodes 180 are located in stripe patterns crossing each other. Therefore, a capacitance is formed at intersections of the second electrode 120 and the third electrode 180. This capacitance is used to realize the touch sensor.

When a detected item such as a finger, a hand or the like approaches the third electrode 180 directly or via another insulating layer in the state where a voltage is applied to the second electrode 120 and the third electrode 180, the capacitance formed by the second electrode 120, the third electrode 180 and the stack structure 184 is changed. This change in the capacitance is sensed, so that the touch is detected and the position of the touch is specified. Namely, the second electrode 120 acts as one electrode (anode electrode or cathode electrode) of the light emitting element 160 and also acts as one electrode of the touch sensor. In other words, the second electrode 120 is shared by the light emitting element 160 and the touch sensor.

The display device 10 in this embodiment includes the plurality of second electrodes 120 electrically independent from each other as top electrodes of the light emitting elements 160. The display device 10 includes the third electrodes 180 on the plurality of second electrodes 120. The third electrodes 180 are provided in a stripe pattern, and cross the second electrodes 120. The capacitances formed by the second electrodes 120 and the third electrodes 180 realize a touch sensor. Namely, the display device 10 acts as a so-called an in-cell touch panel. As described above, a part of the conductive layers included in the display device 10 is used as one electrode of the capacitance element of the touch sensor. In this manner, the touch sensor is included in the display device merely by adding one conductive layer to the conductive layers conventionally included in the display device. Therefore, the display device 10 including the touch panel in this embodiment is produced by a simpler production process at lower cost.

[Circuit Configuration of the Display Device 10]

Figure 5:
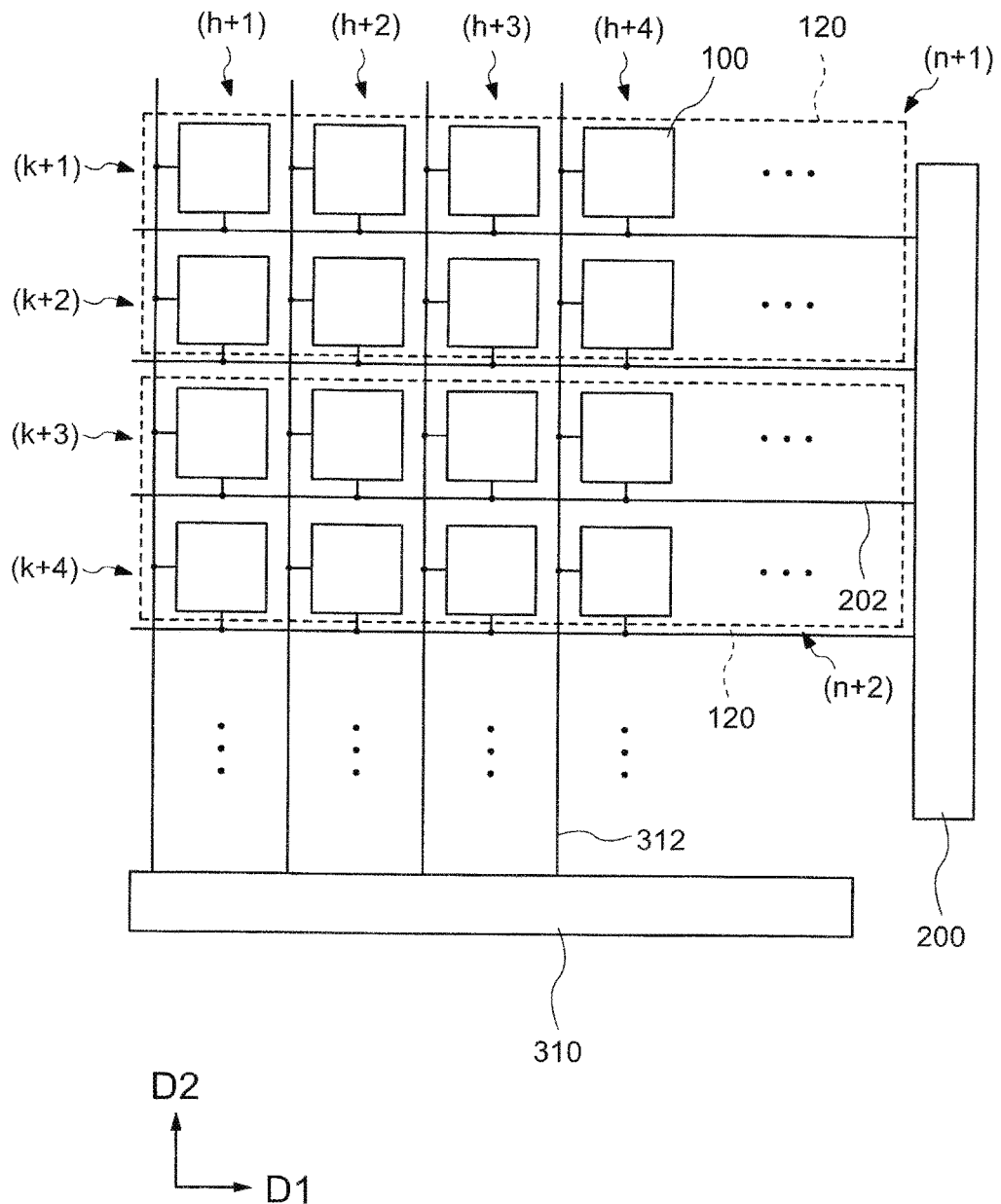
FIG. 5 is a schematic view showing an example of circuit configuration of the display device in an embodiment according to the present invention.

FIG. 5 is a schematic view showing an example of circuit configuration of the display device 10 in an embodiment according to the present invention. As shown in FIG. 5, in the display device 10, the sub pixels 100 are arrayed in a matrix of x rows by y columns. Each sub pixel 100 is controlled by the gate driver circuit 200 and the COG 310. In this example, x=k+1, k+2, k+4, . . . , and y=h+1, h+2, h+3, h+4, . . . . For example, "x=3" represents the sub pixels 100 located in the third row from the top, and "y=3" represents the sub pixels 100 located in the third column from the left (k and h are each an arbitrary integer). FIG. 5 shows, for example, the sub pixels 100 arrayed in 4 rows by 4 columns. The arrangement of the sub pixels 100 is not limited to this, and x and y may each be optionally determined.

Referring to the dotted squares in FIG. 5, the second electrode 120 commonly provided for the (k+1)th row pixel group and the (k+2)th row pixel group adjacent to each other in the second direction D2 is referred to as the (n+1)th block second electrode 120 (hereinafter, referred to as the (n+1)th second electrode 120"), and the second electrode 120 commonly provided for the (k+3)th row pixel group and the (k+4)th row pixel group adjacent to each other in the second direction D2 is referred to as the (n+2)th second electrode 120. Namely, the potential of the second electrode 120 for the sub pixels 100 included in the (k+1)th row pixel group and the potential of the second electrode 120 for the sub pixels 100 included in the (k+2)th row pixel group are the same. Similarly, the potential of the second electrodes 120 for the sub pixels 100 included in the (k+3)th row pixel group and the potential of the second electrode 120 for the sub pixels 100 included in the (k+4)th row pixel group are the same. The (n+1)th second electrode 120 commonly provided for the sub pixels 100 included in the (k+1)th row pixel group and the (k+2)th row pixel group is controlled independently from the (n+2)th second electrode 120 commonly provided for the sub pixels 100 included in the (k+3)th row pixel group and the (k+4)th row pixel group. Although not shown, the second electrodes 120 are each connected with a touch sensor driving line.

The second electrodes 120 are each controlled independently. Therefore, for writing a video signal to, and causing light to be emitted by, the (k+1)th row pixel group and the (k+2)th row pixel group, a cathode power supply potential is supplied to the (n+1)th second electrode 120. By contrast, for driving the touch sensor at a position corresponding to the (n+1)th second electrode 120, a touch sensor driving signal is supplied to the (n+1)th second electrode 120.

The gate driver circuit 200 is connected with control signal lines 202. The control signal lines 202 are connected with gate electrodes of the transistors included in the sub pixels 100. The control signal line 202 may be called "gate lines". As described below in detail, in embodiment 1, reset control signal lines 202-1, output control signal lines 202-2, and pixel control signal lines 202-3 are provided as the control signal lines 202. These control signal lines 202 are selected exclusively and sequentially in a predetermined order for each row.

The COG 310 is connected with data signal lines 312. The data signal lines 312 are connected with either the source electrodes or the drain electrodes of the transistors included in the sub pixels 100. The data signal lines may be called "source lines". In other words, a video signal supplied from an external device is input to the COG 312 via the FPC 320 and is supplied to the sub pixels 100 in each column via the data signal lines 312. As described below in detail, in embodiment 1, video signal lines 312-1 are provided as the data signal lines 312. Reset power supply lines 312-2 and anode power supply lines 312-3 extend in the same direction as the data signal lines 312. These power supply lines may be connected with the COG 310 like the data signal lines 312. The data signal lines 312 each supply a video signal or a predetermined potential to the sub pixels 100 in the row selected by the control signal lines 202.

Figure 6:
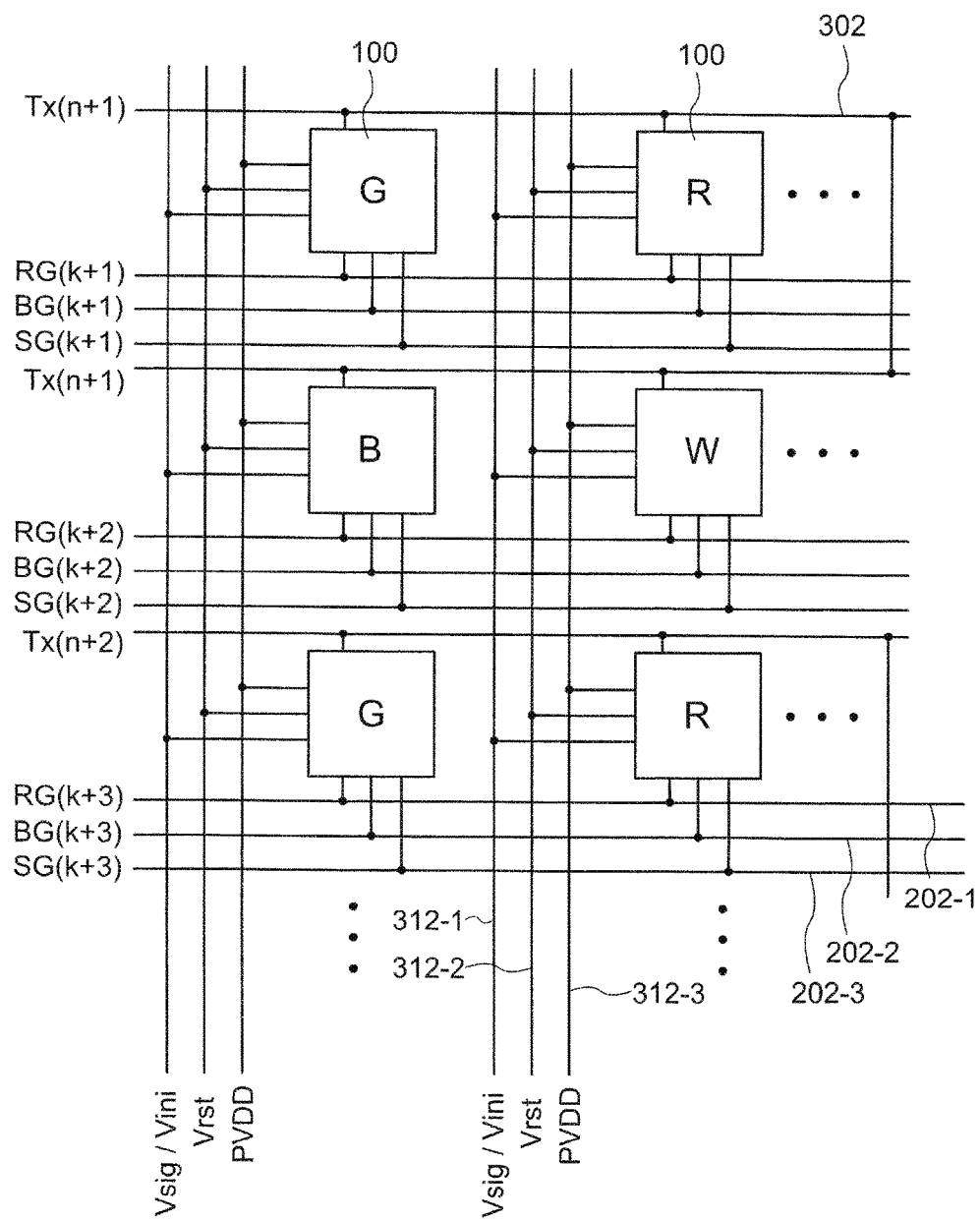
FIG. 6 is a schematic view showing an example of circuit configuration of the display device in an embodiment according to the present invention.

FIG. 6 shows a schematic view showing an example of circuit configuration of the display device 10 in an embodiment according to the present invention. As shown in FIG.

6, the control signal lines 202 each include the reset control signal line 202-1, the output control signal line 202-2, and the pixel control signal line 202-3. The reset control signal line 202-1 is supplied with a reset control signal RG. The output control signal line 202-2 is supplied with an output control signal BG. The pixel control signal line 202-3 is supplied with a pixel control signal SG.

The data signal lines 312 each include the video signal line 312-1. The video signal line 312-1 is supplied with a video signal Vsig and an initialization potential Vini alternately. Power supply lines each include the reset power supply line 312-2 and the anode power supply line 312-3. The reset power supply line 312-2 is supplied with a reset power supply potential Vrst. The anode power supply line 312-3 is supplied with an anode power supply potential PVDD.

Touch sensor driving lines 302 extend perpendicular to the data signal lines 312, namely, in the row direction. The touch sensor driving line 302 on the (n+1)th block is commonly provided for the (k+1)th row pixel group and the (k+2)th row pixel group. The touch sensor driving lines 302 are each supplied with a cathode power supply potential PVSS and a touch sensor driving signal Tx alternately.

[Pixel Circuit Configuration of the Sub Pixel 100]

Figure 7:
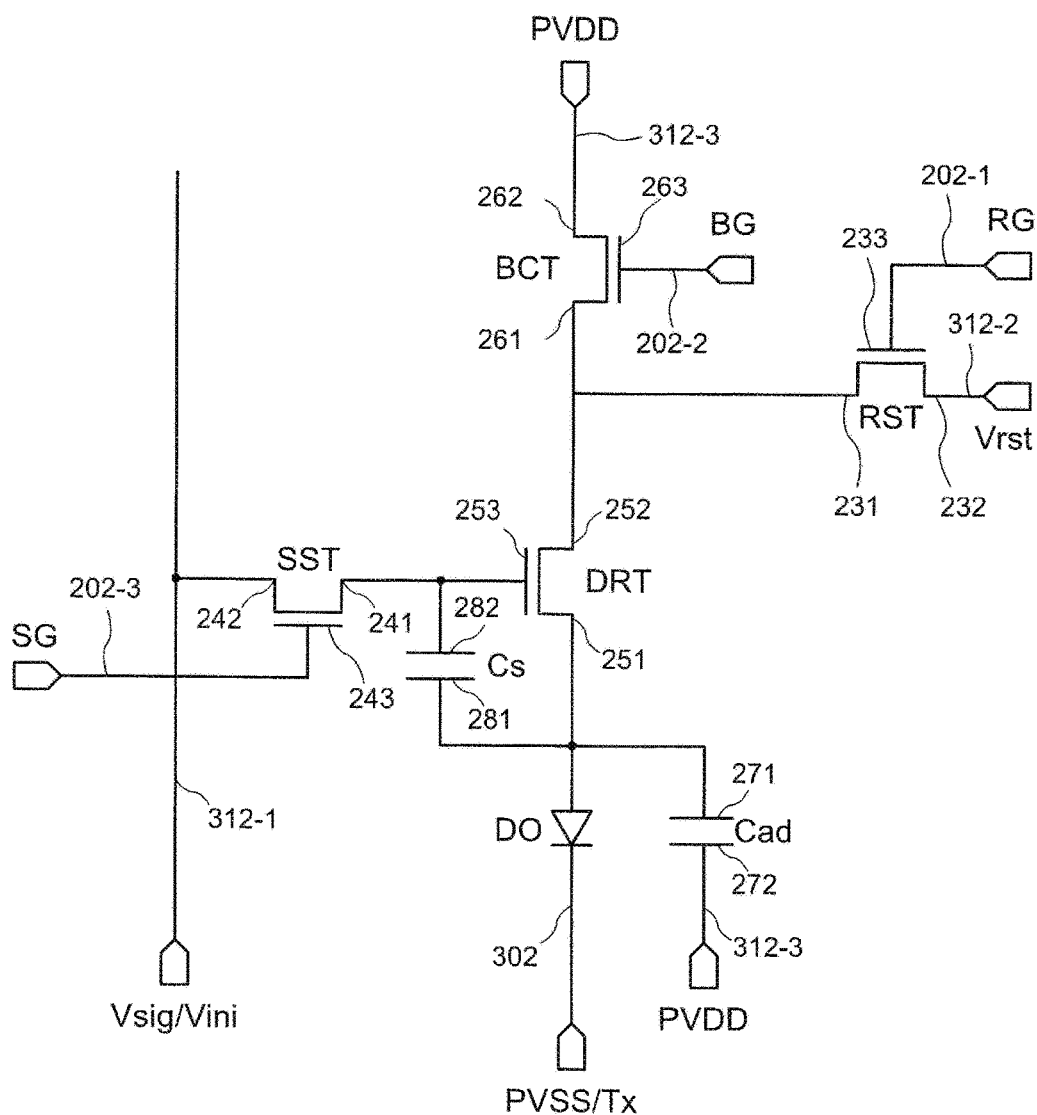
FIG. 7 is a circuit diagram showing an example of circuit configuration of a pixel circuit of the display device in an embodiment according to the present invention.

FIG. 7 is a circuit diagram showing an example of circuit configuration of the pixel circuit in an embodiment according to the present invention. The transistors included in the sub pixel 100 shown in FIG. 7 are all n-channel transistors. As shown in FIG. 7, the sub pixel 100 includes a light emitting element DO, a driving transistor DRT, an output transistor BCT, a reset transistor RST, a pixel selection transistor SST, a storage capacitance Cs, and an auxiliary capacitance Cad. In the following description, one terminal among the source terminal and the drain terminal of each transistor will be referred to as a "first terminal", and the other terminal will be referred to as a "second terminal". Among a pair of terminals of each capacitance, one terminal will be referred to as a "first terminal" and the other terminal will be referred to as a "second terminal".

A first terminal 251 of the driving transistor DRT is connected with an anode terminal of the light emitting element DO, a first terminal 281 of the storage capacitance Cs, and a first terminal 271 of the auxiliary capacitance Cad. A second terminal 252 of the driving transistor DRT is connected with a first terminal 261 of the output transistor BCT and a first terminal 231 of the reset transistor RST. A cathode terminal of the light emitting element DO is connected with the touch sensor driving line 302. A second terminal 272 of the auxiliary capacitance Cad is connected with the anode power supply line 312-3. A second terminal 262 of the output transistor BCT is connected with the anode power supply line 312-3. A second terminal 232 of the reset transistor RST is connected with the reset power supply line 312-2.

A first terminal 241 of the pixel selection transistor SST is connected with a gate terminal 253 of the driving transistor DRT and a second terminal 282 of the storage capacitance Cs. A second terminal 242 of the pixel selection transistor SST is connected with the video signal line 312-1. A second terminal 272 of the auxiliary capacitance Cad may be connected with the touch sensor driving lines 302.

A gate terminal 233 of the reset transistor RST is connected with the reset control signal line 202-1. A gate 263 of the output transistor BCT is connected with the output control signal line 202-2. A gate terminal 243 of the pixel selection transistor SST is connected with the pixel control signal line 202-3.

The above-described configuration may be expressed as follows. The anode power supply line 312-3 supplies the anode power supply potential PVDD to the first electrode 124 included in each of the plurality of sub pixels 100. The touch sensor driving line 302 supplies the cathode power supply potential PVSS and the touch sensor driving signal Tx alternately to the second electrode 120 commonly provided for the plurality of sub pixels 100. Namely, each sub pixel 100 is located between the anode power supply line 312-3 and the touch sensor driving line 302. The touch sensor driving line 302 is supplied with the cathode power supply potential PVSS of the light emitting element DO, and thus may be referred to as a "cathode power supply line". The potential difference between the anode power supply potential PVDD and the cathode power supply potential PVSS is determined based on the light emission intensity of the light emitting element DO.

The anode terminal of the light emitting element DO corresponds to the first electrode 124. Thus, the first terminal 251 of the driving transistor DRT may be expressed as being connected with the first electrode 124. The second terminal 252 of the driving transistor DRT may be expressed as being connected with the anode power supply line 312-3 via the output transistor BCT. The output transistor BCT switches the state between the anode power supply line 312-3 and the driving transistor DRT to a conductive state or a non-conductive state.

In embodiment 1, all the transistors included in the sub pixel 100 are all n-channel transistors. The present invention is not limited to such a structure. For example, all the transistors included in the sub pixel 100 except for the driving transistor DRT may be p-channel transistors. Alternatively, the transistors included in the sub pixel 100 except for the driving transistor DRT may include both of n-channel and p-channel transistors. Each of the above-described transistors merely needs to be a switching element switchable between an ON state and an OFF state. Switching elements may be used instead of the transistors.

[Method for Driving the Pixel Circuit in the Sub Pixel 100]

Figure 8:
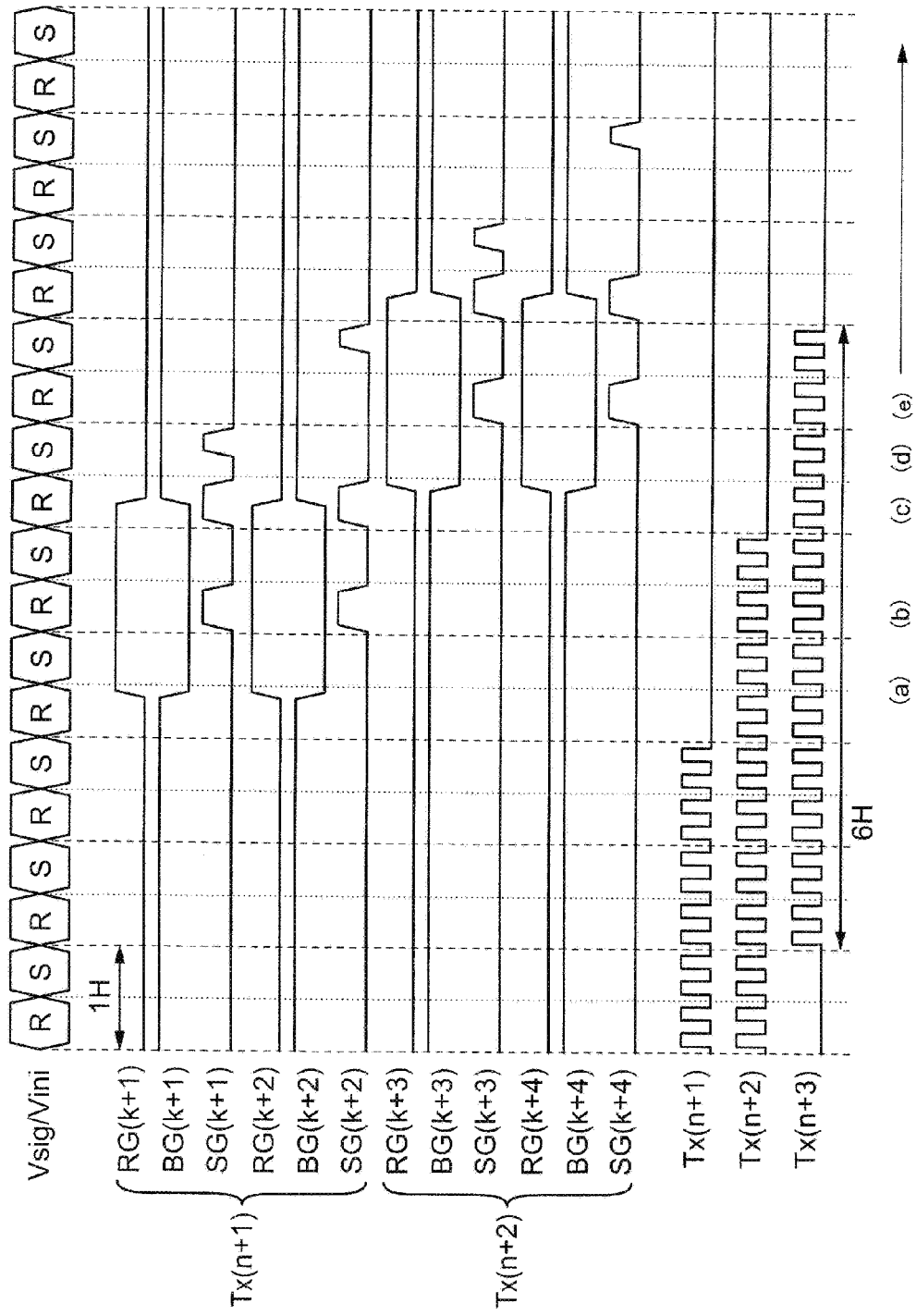
FIG. 8 is a timing diagram showing a method for driving the pixel circuit of the display device in an embodiment according to the present invention.

FIG. 8 is a timing diagram showing a method for driving the pixel circuit of the display device 10 in an embodiment according to the present invention. The following driving of the pixel circuit is performed by the controller 50 shown in FIG. 1. In this embodiment, all the transistors included in the pixel circuit are n-channel transistors. Therefore, when a "low-level" control signal is supplied to the gate terminal of a transistor, the transistor is put into an OFF state (non-conductive state). By contrast, when a "high-level" control signal is supplied to the gate terminal of a transistor, the transistor is put into an ON state (conductive state). Hereinafter, the method for driving the display device 10 will be described with reference to the circuit diagram in FIG. 7 and the timing diagram in FIG. 8. In this example, a video signal is written to the (k+1)th row pixel group. In FIG. 7, the sign "R" represents the initialization potential Vini. The sign "S" represents the video signal Vsig.

As shown in FIG. 8, the method for driving the display device 10 includes a source initialization period (a), a gate initialization period (b), a threshold value compensation period (c), a writing period (d), and a light emission period (e). These periods will be described with reference to FIG. 7 and FIG. 8. FIG. 8 shows a plurality of periods defined by dotted lines. Two such periods correspond to one horizontal period (1H). "One horizontal period" is a period required to write a video signal to the sub pixels 100 in one row.

(a) Source Initialization Period

In the source initialization period, the reset control signal RG becomes from the low level to the high level, and the output control signal BG becomes from the high level to the low level. Namely, the reset transistor RST is put into an ON state, and the output transistor BCT is put into an OFF state. Therefore, the second terminal 252 of the driving transistor DRT is disconnected from the anode power supply line 312-3 by the output transistor BCT. The second terminal 252 of the driving transistor DRT is supplied with the reset power supply potential Vrst via the reset transistor RST. The pixel control signal SG is kept at the low level, and thus the pixel selection transistor SST is kept in the OFF state.

In order to put the driving transistor DRT into an ON state, the reset power supply potential Vrst is set to a level lower than a floating potential of the gate terminal 253 of the driving transistor DRT (i.e., the floating potential is a potential that may possibly be supplied to the gate terminal 253). As a result of this operation, the first terminal 251 and the second terminal 252 of the driving transistor DRT are reset to the same potential as the reset power supply potential Vrst. The reset power supply potential Vrst may be set to a level lower than the cathode power supply potential PVSS. It should be noted that the reset power supply potential Vrst does not necessarily need to be lower than the cathode power supply potential PVSS, and may be set to a level at which the electric current does not flow to the light emitting element DO in the source initialization period. Specifically, the reset power supply potential Vrst may be set to a level lower than the cathode power supply potential PVSS by a threshold voltage of the driving transistor DRT. As a result of these operations, the supply of the electric current to the light emitting element DO is stopped and the display device 10 is put into a non-light emission state.

(b) Gate Initialization Period

In the gate initialization period, the pixel control signal SG becomes from the low level to the high level, and thus the pixel selection transistor SST is put into an ON state. Therefore, the gate terminal 253 of the driving transistor DRT is connected with the video signal line 312-1 via the pixel selection transistor SST. At this point, the video signal line 312-1 is supplied with an initialization potential Vini, and thus the gate terminal 253 of the driving transistor DRT is supplied with the initialization potential Vini.

The initialization potential Vini is set to a level higher than the reset power supply potential Vrst. Therefore, in the driving transistor DRT, the initialization potential (Vini) of the gate terminal 253 is higher than the reset power supply potential (Vrst) of the second terminal 252. As a result, the driving transistor DRT is put into an ON state. During the gate initialization period, the storage capacitance Cs stores a charge based on the potential difference between the reset power supply potential Vrst and the initialization potential Vini.

(c) Threshold Value Compensation Period

In the threshold value compensation period, first, the pixel control signal SG becomes from the low level to the high level, and thus the pixel selection transistor SST is put into an ON state. At this point, the video signal line 312-1 is supplied with the initialization potential Vini. Therefore, the potential of the gate terminal 253 of the driving transistor DRT is fixed to the initialization potential Vini. Next, the reset control signal RG becomes from the high level to the low level, and the output control signal BG becomes from the low level to the high level. Namely, the reset transistor RST is put into an OFF state, and the output transistor BCT is put into an ON state. Therefore, the second terminal 253 of the driving transistor DRT is disconnected from the reset power supply line 312-2 by the reset transistor RST. By contrast, the second terminal 252 of the driving transistor DRT is supplied with the anode power supply potential PVDD via the output transistor BCT.

The potential of the gate terminal 253 of the driving transistor DRT is fixed to the initialization potential Vini, which is higher than the reset power supply portion Vrst. Therefore, the driving transistor DRT is in an ON state. Thus, the electric current flows in the channel of the driving transistor DRT by the anode power supply potential PVDD supplied to the second terminal 252 of the driving transistor DRT, and thus the potential of the first terminal 251 is increased. When the potential difference between the first terminal 251 and the gate terminal 253 reaches the threshold voltage (VTH) of the driving transistor DRT, the driving transistor DRT is put into an OFF state. Specifically, since the potential of the gate terminal 253 is fixed to the initialization potential Vini, when the potential of the first terminal 251 reaches (Vini−VTH), the driving transistor DRT is put into an OFF state.

At this point, the second terminal 282 of the storage capacitance Cs is supplied with the initialization potential Vini, and the first terminal 281 of the storage capacitance Cs is supplied with (Vini−VTH). Therefore, the storage capacitance Cs stores a charge based on VTH. In other words, in the threshold value compensation period, information based on VTH of the driving transistor DRT is stored in the storage capacitance Cs. In order to suppress light emission of the light emitting element DO in the threshold value compensation period, it is preferable to set the initialization potential Vini such that {(Vini−VTH)−PVSS}<threshold voltage of the light emitting element DO.

(d) Writing Period

In the writing period, the pixel control signal SG becomes from the low level to the high level in the state where the reset control signal RG is at the low level and the output control signal BG is at the high level. Namely, the pixel selection transistor SST is put into an ON state in the state where the reset transistor RST is in an OFF state and the output transistor BCT is in an ON state. At this point, the video signal line 312-1 is supplied with the video signal Vsig. As a result, the potential of the gate terminal 253 of the driving transistor DRT and the potential of the second terminal 282 of the storage capacitance Cs change from Vini to Vsig.

When the potential of the second terminal 282 of the storage capacitance Cs changes from Vini to Vsig, the potential of the first terminal 281 of the storage capacitance Cs is increased based on (Vsig−Vini). Specifically, since the storage capacitance Cs and the auxiliary capacitance Cad are connected with each other in series, the potential (Vs) of the first terminal 281 located between these capacitances is represented by the following expression (1).

[Expression 1]

$$Vs = (Vini - VTH) + (Vsig - Vini)\frac{Cs}{Cs + Cad} \quad (1)$$

Therefore, the potential difference (Vgs) between the first terminal 251 and the gate terminal 253 is represented by the following expression (2). Namely, the video signal Vsig is supplied to the gate terminal 253, so that a charge based on VTH of the driving transistor DRT and the video signal Vsig is stored in the storage capacitance Cs. Thus, the driving transistor DRT is put into an ON state based on the potential difference obtained as a result of addition of VTH of the driving transistor DRT to the video signal Vsig.

[Expression 2]

$$Vgs = Vsig - \left\{(Vini - VTH) + (Vsig - Vini)\frac{Cs}{Cs + Cad}\right\} \quad (2)$$

(e) Light Emission Period

In the light emission period, the pixel control signal SG becomes the low level in the state where the reset control signal RG is at the low level and the output control signal BG is at the high level. Namely, the pixel selection transistor SST is put into an OFF state in the state where the reset transistor RST is in an OFF state and the output transistor BCT is in an ON state. In this manner, the driving transistor DRT supplies the light emitting element DO with an electric current based on the potential difference, represented by expression (2), between the video signal Vsig supplied to the gate terminal 253 and the anode power supply potential PVDD supplied to the second terminal 252.

An electric current (Id) flowing in the driving transistor DRT is represented by the following expression (3). Expression (2) is substituted into expression (3), so that the VTH component of the driving transistor DRT is erased from expression (3). As a result, Id does not depend on VTH as represented by the following expression (4).

[Expression 3]

$$Id = \beta(Vgs - VTH)^2 \quad (3)$$

[Expression 4]

$$Id = \beta\left\{(Vsig - Vini)\frac{Cad}{Cs + Cad}\right\}^2 \quad (4)$$

In the above-described manner, in the light emission period, an electric current having the influence of VTH of the driving transistor DRT removed is supplied to the light emitting element DO. Namely, an electric current having VTH of the driving transistor DRT compensated for is supplied to the light emitting element DO. The light emission period is maintained until the output control signal BG becomes the low level one frame period later. The controller 50 repeats the source initialization period (a), the gate initialization period (b), the threshold value compensation period (c), the writing period (d), and the light emission period (e) in this order sequentially. The controller 50 controls the periods (a) through (e) to be provided for a subsequent row pixel group. Thus, the controller 50 provides the periods (a) through (e) for row pixel groups corresponding to one frame.

[Method for Driving the Touch Sensor]

With reference to FIG. 8, a method for driving the touch sensor in the display device 10 will be described. As shown in FIG. 5, in this embodiment, the (n+1)th second electrode 120 is commonly provided for the (k+1)th row pixel group and the (k+2)th row pixel group adjacent to each other in the second direction D2. Namely, the touch sensor is driven at the same time at the positions corresponding to two row pixel groups adjacent to each other, specifically, the (k+1)th row pixel group and the (k+2)th row pixel group. The (n+1)th second electrode 120 is supplied with the touch sensor driving signal Tx(n+1).

The source initialization period (a), the gate initialization period (b), the threshold value compensation period (c), the writing period (d), and the light emission period (e) are set to be provided as follows. Each of the source initialization period (a), the gate initialization period (b), and the threshold value compensation period (c) is provided concurrently for the (k+1)th row pixel group and the (k+2)th row pixel group. After the threshold value compensation period (c), the writing period (d) is provided sequentially for the (k+1)th row pixel group and the (k+2)th row pixel group in synchronization with the timing of the video signal Vsig. After the writing period (d), the light emission period (e) is provided sequentially for the (k+1)th row pixel group and the (k+2)th row pixel group. Specifically, the writing period (d) for the (k+2)th row pixel group is the same time period as the light emission period (e) for the (k+1)th row pixel group.

The touch sensor driving signal Tx is supplied to the second electrode 120 via the touch sensor driving line 302 in a second half of the light emission period (e). Specifically, the touch sensor driving signal Tx is supplied to the second electrode 120 in a part of the light emission period (e), more specifically, in six horizontal periods (6H) immediately before the source initialization period (a) in the next frame starts. In other words, the second electrode 120 is supplied with the cathode power supply potential PRSS in each of periods (a) through (d). In the light emission period (e), the second electrode 120 is supplied with the touch sensor driving signal Tx after being supplied with the cathode power supply potential PVSS. The period in which the second electrode 120 is supplied with the touch sensor driving signal Tx is referred to as a "touch sensor driving period".

In the example shown in FIG. 8, the touch sensor driving period is 6H immediately before the source initialization period starts (a). The present invention is not limited to this. For example, the touch sensor driving period may be 5H or shorter, or 7H or longer. Alternatively, a blank period of 1H or longer may be provided between the touch sensor driving period and the source initialization period (a).

Figure 9:
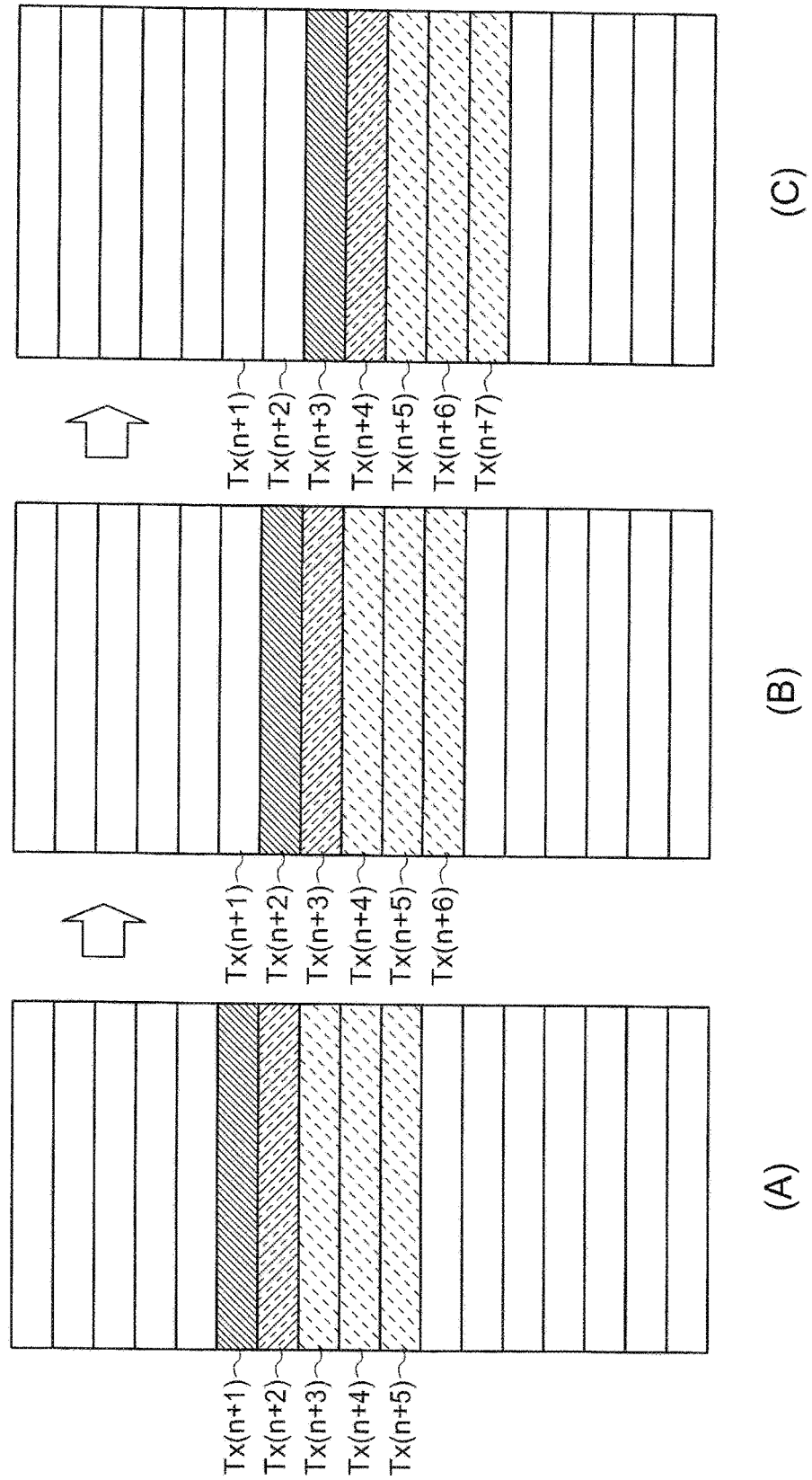
FIG. 9 shows an operation of the display device in an embodiment according to the present invention.

FIG. 9 shows an operation of the display device 10 in an embodiment according to the present invention. In the state of (A) in FIG. 9, the sub pixels sharing the (n+1)th second electrode 120 (row pixel groups corresponding to Tx(n+1)) are in the threshold value compensation period (c) and the writing period (d). The sub pixels sharing the (n+2)th second electrode 120 (row pixel groups corresponding to Tx(n+2)) are in the source initialization period (a) and the gate initialization period (b). The sub pixels sharing the (n+3)th through (n+5)th second electrodes 120 (row pixel groups corresponding to Tx(n+3) through Tx(n+5)) are in the touch signal driving period.

In the state of (B) in FIG. 9, the sub pixels sharing the (n+1)th second electrode 120 are in the light emission period (e). The sub pixels sharing the (n+2)th second electrode 120 are in the threshold value compensation period (c) and the writing period (d). The sub pixels sharing the (n+3)th second electrode 120 are in the source initialization period (a) and the gate initialization period (b). The sub pixels sharing the (n+4)th through (n+6)th second electrodes 120 are in the touch signal driving period.

In the state of (C) in FIG. 9, the sub pixels sharing the (n+1)th and (n+2)th second electrodes 120 are in the light emission period (e). The sub pixels sharing the (n+3)th second electrode 120 are in the threshold value compensation period (c) and the writing period (d). The sub pixels sharing the (n+4)th second electrode 120 are in the source initialization period (a) and the gate initialization period (b). The sub pixels sharing the (n+5)th through (n+7)th second electrodes 120 are in the touch signal driving period. In this manner, in the display device 10, the source initialization period (a) and the gate source initialization period (b) (hereinafter, collectively referred to as "initialization period (a)-(b)"), the threshold value compensation period (c) and the writing period (d) (hereinafter, collectively referred to as "the writing period (c)-(d)"), and the light emission period (e) provided for each row pixel group are each transferred to, namely, provided for, the subsequent row pixel group.

In the light emission period (e), the (k+1)th row pixel group and the (k+2)th row pixel group keep on emitting light at a light emission intensity based on the video signal. However, when about one frame passes, more specifically, immediately before the source initialization period (a) of the next frame starts, the light emission intensity of the (k+1)th row pixel group and the (k+2)th row pixel group may be changed from the desired light emission intensity by the influence of, for example, a leak current between the source electrode and the drain electrode of the pixel selection transistor SST or a leak current of the storage capacitance Cs. Specifically, the gate potential of the driving transistor DRT is changed by such a leak current to decrease the electric current (Id) flowing in the driving transistor DRT. As a result, the light emission intensity in one frame period becomes lower in a second half thereof than in a first period thereof. Therefore, even though the touch sensor driving signal Tx is supplied to the second electrode 120 in such a period in which the light emission intensity is low, the supply of the touch sensor driving signal Tx does not influence the display almost at all.

As described above, according to the method for driving the display device 10 including the touch sensor in embodiment 1, the anode electrode of the light emitting element is usable as the touch sensor driving electrode with substantially no influence on the display quality.

Embodiment 2

Figure 10:
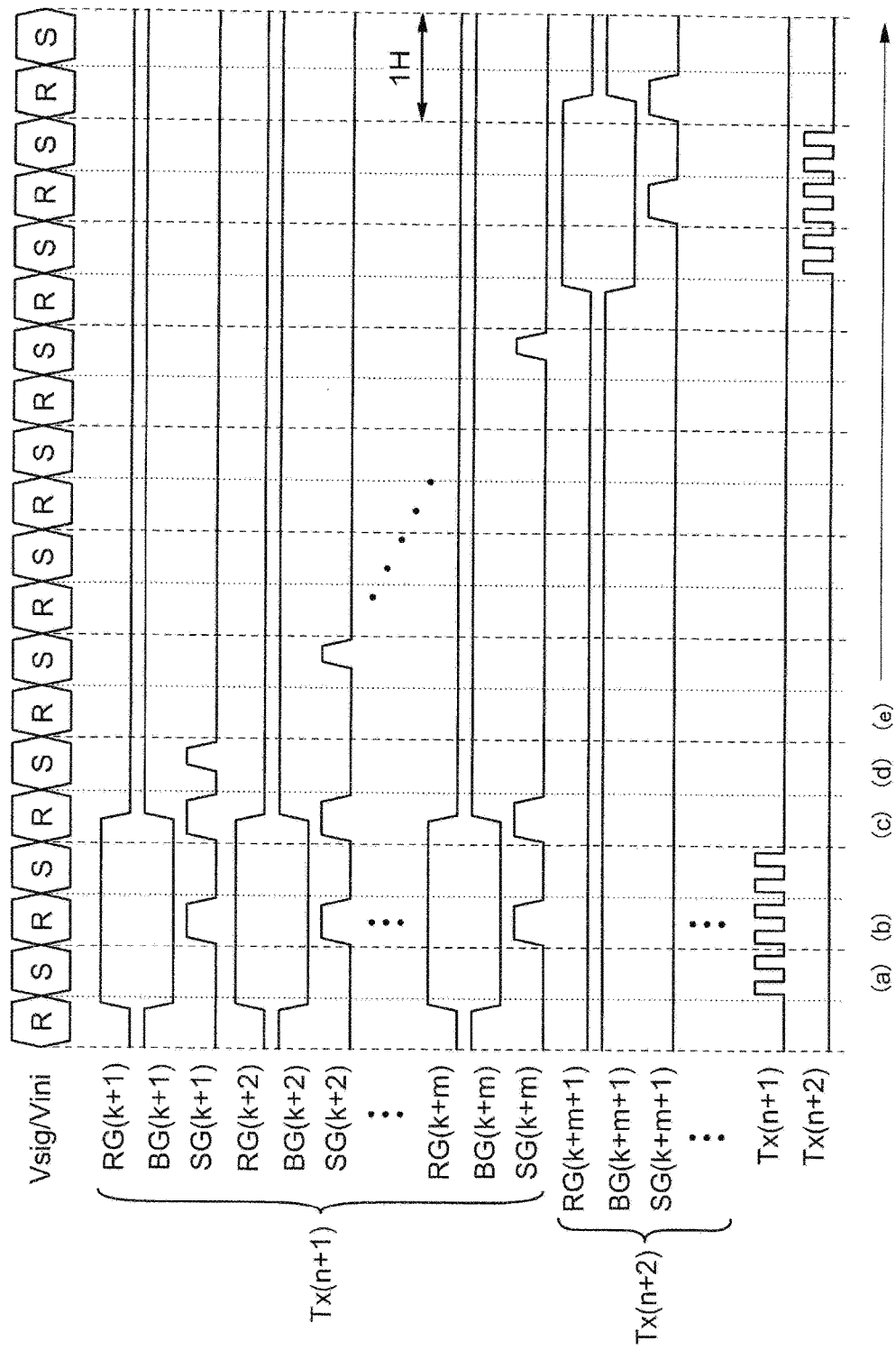
FIG. 10 is a timing diagram showing a method for driving a pixel circuit of a display device in an embodiment according to the present invention.
Figure 11:
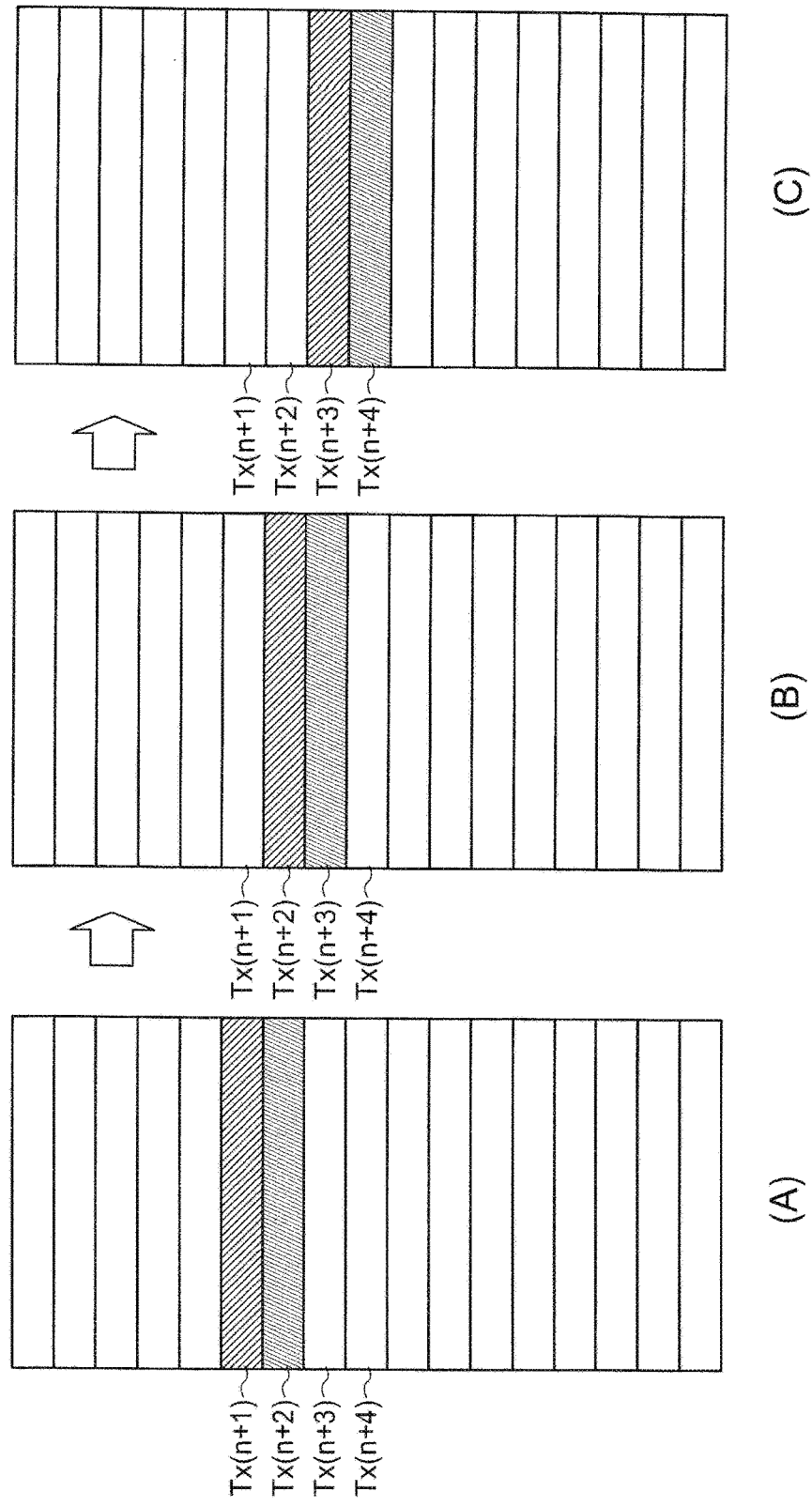
FIG. 11 shows an operation of the display device in an embodiment according to the present invention.

With reference to FIG. 10 and FIG. 11, an overview of a display device in an embodiment according to the present invention will be described. In embodiment 2, display and touch sensing are performed by a different method from that in embodiment 1. In a display device 10A in embodiment 2, second electrodes 120A are each commonly provided for m rows of sub pixels 100A arrayed in the second direction D2 (m is an integer of 1 or greater). Except for this, the cross-sectional structure and the circuit configuration of the display device 10A are substantially the same as those of the display device 10 in embodiment 1, and thus will not be described. The following embodiment is merely an example of the present invention.

FIG. 10 is a timing diagram showing a method for driving a pixel circuit of the display device 10A in an embodiment according to the present invention. The driving of the pixel circuit described below is performed by a controller 50A in the display device 10A. In the display device 10A, the second electrode 120A is commonly provided for m rows of sub pixels 100A. Therefore, the initialization period (a)-(b) is provided for the (k+1)th row pixel group through the (k+m)th row pixel group in the same horizontal period. In other words, the pixels sharing the second electrode 120A are in the initialization period (a)-(b) in the same time period.

In the display device 10A, in the initialization period (a)-(b), the (n+1)th second electrode 120A is supplied with the touch sensor driving signal Tx(n+1). After the initialization period (a)-(b), the writing period (c)-(d) and the light emission period (e) are provided. In the writing period (c)-(d) and the light emission period (e), the (n+1)th second electrode 120A is supplied with the cathode power supply potential PVSS. In the writing period (c)-(d), the writing period (d) is provided for the (k+1)th row pixel group through (k+m)th row pixel group sharing the (n+1)th second electrode 120A in the order of the (k+1)th row pixel group, the (k+2)th row pixel group, . . . and the (k+m)th row pixel group. These row pixel groups are sequentially supplied with the video signal Vsig.

FIG. 11 shows an operation of the display device 10A in an embodiment according to the present invention. In the state of (A) in FIG. 11, the sub pixels sharing the (n+1)th second electrode 120A (row pixel groups corresponding to Tx(n+1)) are in the writing period (c)-(d). The sub pixels sharing the (n+2)th second electrode 120A (row pixel groups corresponding to Tx(n+2)) are in the initialization period (a)-(b) and the touch sensor driving period. The sub pixels sharing the (n+3)th and (n+4)th second electrodes 120A (row pixel groups corresponding to Tx(n+3) and Tx(n+4)) are in the light emission period (e).

In the state of (B) in FIG. 11, the sub pixels sharing the (n+1)th and (n+4)th second electrodes 120A are in the light emission period (e). The sub pixels sharing the (n+2)th second electrode 120A are in the writing period (c)-(d). The sub pixels sharing the (n+3)th second electrode 120A are in the initialization period (a)-(b) and the touch signal driving period.

In the state of (C) in FIG. 11, the sub pixels sharing the (n+1)th and (n+2)th second electrodes 120A are in the light emission period (e). The sub pixels sharing the (n+3)th second electrode 120A are in the writing period (c)-(d). The sub pixels sharing the (n+4)th second electrode 120A are in the initialization period (a)-(b) and the touch sensor driving period.

As described above, according to the method for driving the display device 10A including the touch sensor in embodiment 2, the second electrode 120A is supplied with the touch sensor driving signal Tx in the initialization period (a)-(b), in which the row pixel groups do not emit light. Therefore, the anode electrode of the light emitting element is usable as the touch sensor driving electrode with substantially no influence on the light emission intensity.

Embodiment 3

Figure 12:
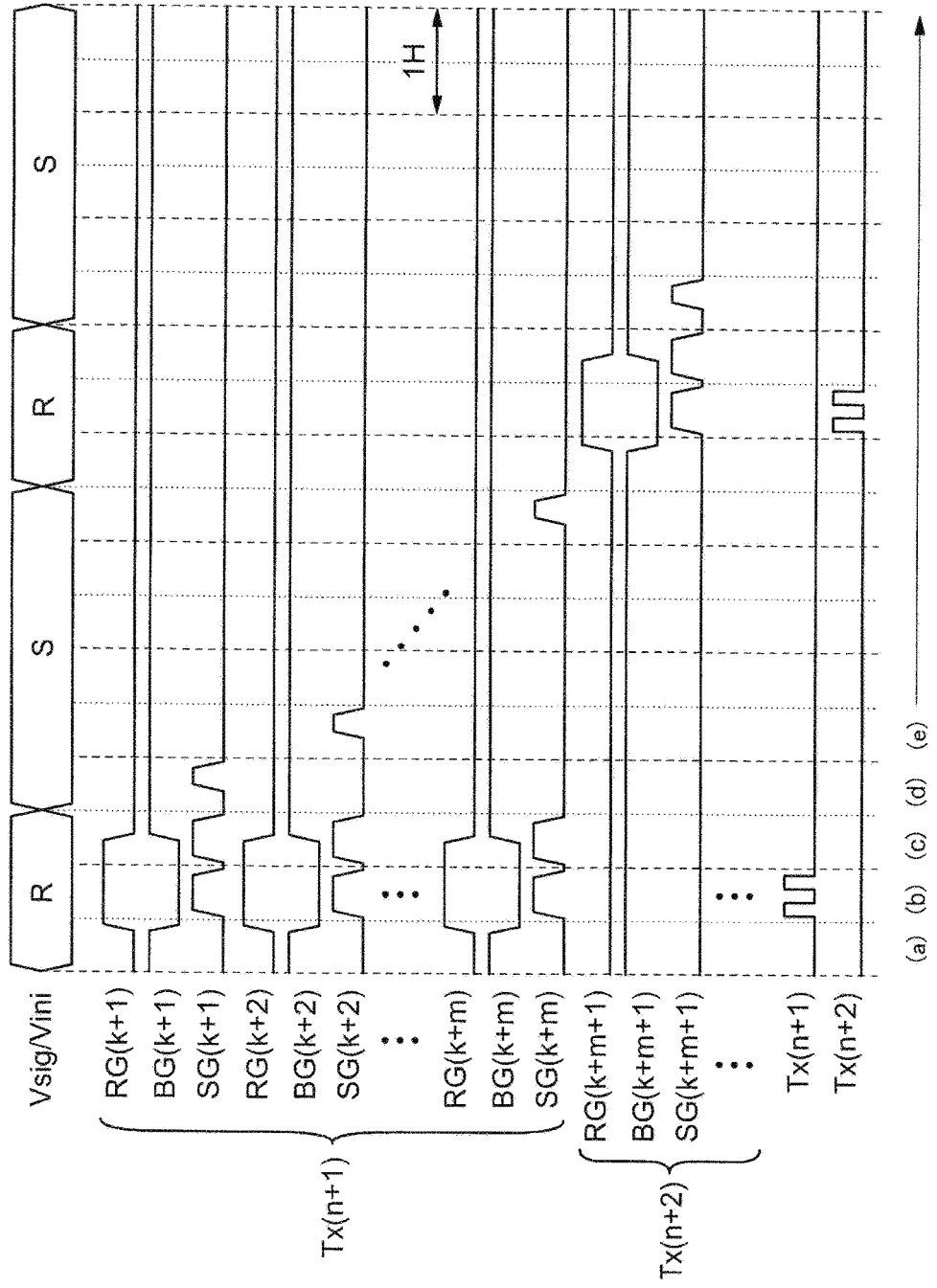
FIG. 12 is a timing diagram showing a method for driving a pixel circuit of a display device in an embodiment according to the present invention.

With reference to FIG. 12, an overview of a display device in an embodiment according to the present invention will be described. In embodiment 3, a display device 10B is driven by a method that is similar to the method for driving the display device 10A in embodiment 2 but is different therefrom in the timing at which the video signal Vsig and the initialization potential Vini are input to a video signal line 312B-1. Except for this, the cross-sectional structure and the circuit configuration of the display device 10B are substantially the same as those of the display device 10A, and thus will not be described. The following embodiment is merely an example of the present invention.

FIG. 12 is a timing diagram showing a method for driving a pixel circuit of the display device 10B in an embodiment according to the present invention. The driving of the pixel circuit described below is performed by a controller 50B in the display device 10B. In the timing diagram shown in FIG.

10, a video signal line 312A-1 is supplied with the video signal Vsig in a second half of the source initialization period (a) and between the gate initialization period (b) and the threshold value compensation period (c). By contrast, in the timing diagram shown in FIG. 12, the video signal Vsig is not input to the video signal line 312B-1 and only the initialization potential Vini is input in the periods (a) through (c). In the timing diagram shown in FIG. 10, the initialization potential Vini is input to the video signal line 312A-1 between the threshold value compensation period (c) and the writing period (d) and in the light emission period (e). By contrast, in the timing diagram shown in FIG. 12, the initialization potential Vini is not input to the video signal line 312B-1 and only the video signal Vsig is input in the periods (d) through (e).

In the display device 10B, second electrodes 120B are each commonly provided for m rows of sub pixels 100B. Therefore, the initialization period (a)-(b) is provided for the (k+1)th row pixel group and for the (k+2)th row pixel group in the same horizontal period. In other words, the row pixel groups sharing the second electrode 120A are in the initialization period (a)-(b) in the same time period. In still other words, the row pixel groups to be supplied with the touch sensor driving signal Tx(n+1) are initialized at the same time. In the initialization period (a)-(b), the second electrode 120B does not contribute to display of the display device 10B. Therefore, the second electrode 120B is supplied with the touch sensor driving signal Tx(n+1). In the example shown in FIG. 12, the second electrode 120B is supplied with the touch sensor driving signal Tx(n+1) only in the gate initialization period (b). Alternatively, the second electrode 120B may be supplied with the touch sensor driving signal Tx(n+1) in the source initialization period (a).

Like in FIG. 10, after the initialization period (a)-(b), the writing period (c)-(d) and the light emission period (e) are provided. In the writing period (c)-(d) and the light emission period (e), the (n+1)th second electrode 120B is supplied with the cathode power supply potential PVSS. In the writing period (c)-(d), the writing period (d) is provided for the (k+1)th row pixel group through the (k+m)th row pixel group sharing the (n+1)th second electrode 120B in the order of the (k+1)th row pixel group, the (k+2)th row pixel group, . . . and the (k+m)th row pixel group. These row pixel groups are sequentially supplied with the video signal Vsig.

As described above, according to the method for driving the display device 10B including the touch sensor in embodiment 3, a period in which the video signal Vsig is to be input to the video signal line 312B-1 is omitted from the periods (a) through (c), and a period in which the initialization potential Vini is to be input to the video signal line 312B-1 is omitted from the periods (d) and (e). Therefore, the time period for each 1H is extended, or a frame rate of a higher frequency is realized.

Embodiment 4

Figure 13:
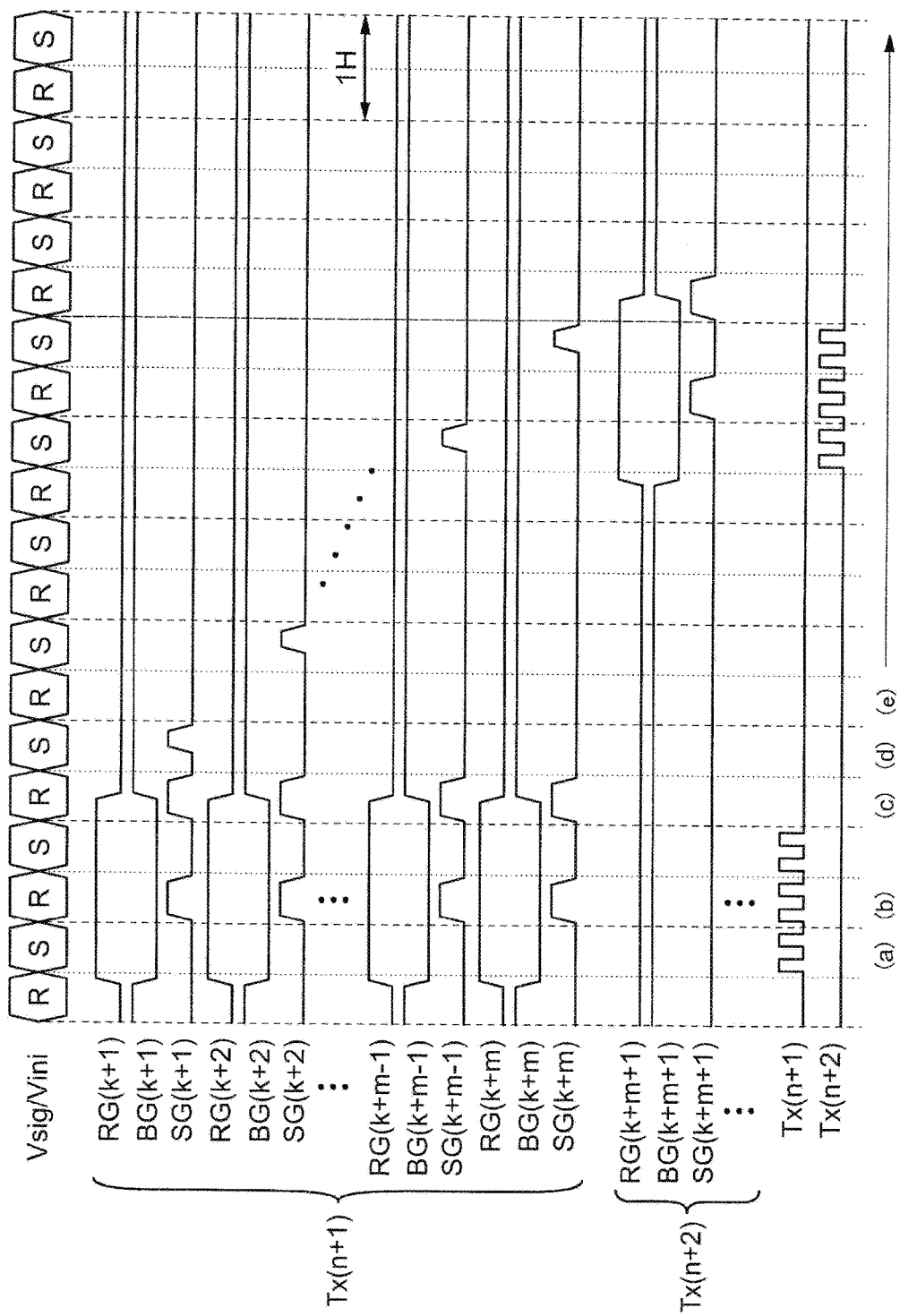
FIG. 13 is a timing diagram showing a method for driving a pixel circuit of a display device in an embodiment according to the present invention.

With reference to FIG. 13, an overview of a display device in an embodiment according to the present invention will be described. In embodiment 4, a display device 100 is driven by a method that is similar to the method for driving the display device 10A in embodiment 2. Unlike in the method for driving the display device 10A, in the method for driving the display device 10C, in the writing period (c)-(d) for the sub pixels sharing the (n+1)th second electrode 120C (row pixel groups corresponding to Tx(n+1)), the initialization period (a)-(b) for the sub pixels sharing the (n+2)th second electrode 120C (row pixel groups corresponding to Tx(n+2)) is provided. Except for this, the cross-sectional structure and the circuit configuration of the display device 10C are substantially the same as those of the display device 10 in embodiment 1, and thus will not be described. The following embodiment is merely an example of the present invention.

FIG. 13 is a timing diagram showing a method for driving a pixel circuit of the display device 10C in an embodiment according to the present invention. The driving of the pixel circuit described below is performed by a controller 50C in the display device 100. Referring to FIG. 13, the (n+1)th second electrode 120C corresponding to Tx(n+1) and the (n+2)th second electrode 120C corresponding to Tx(n+2) are located side by side in the second direction D2. In FIG. 13, the writing period (d) for the (k+m−1)th row pixel group through the (k+m)th row pixel group sharing the (n+1)th second electrode 120C is provided in the same time period as the initialization period (a)-(b) for the (k+m+1)th row pixel group through the (k+2m)th row pixel group sharing the (n+2)th second electrode 120C.

The above-described driving method may be expressed as follows. During the writing period (d) for the m row pixel groups sharing the (n+1)th second electrode 120C, the initialization period (a)-(b) for the m row pixel groups sharing the (n+2)th second electrode 120C is started. In other words, regarding a pair of second electrodes 120C adjacent to each other in the second direction D2 (second electrodes 120C corresponding to Tx(n+1) and Tx(n+2)), in the initialization period (a)-(b) for the row pixel groups corresponding to one second electrode 120C (second electrode 120C corresponding to (Tx(n+2)), the writing period (d) for the row pixel groups corresponding to the other second electrode 120C (second electrode 120C corresponding to (Tx(n+1)) is provided.

As described above, according to the method for driving the display device 10C including the touch sensor in embodiment 4, during the writing period for the row pixel groups sharing the (n+1)th second electrode 120C, the initialization period for the row pixel groups sharing the (n+2)th second electrode 120C is started. Therefore, the time period for each 1H is extended, or a frame rate of a higher frequency is realized.

Embodiment 5

Figure 14:
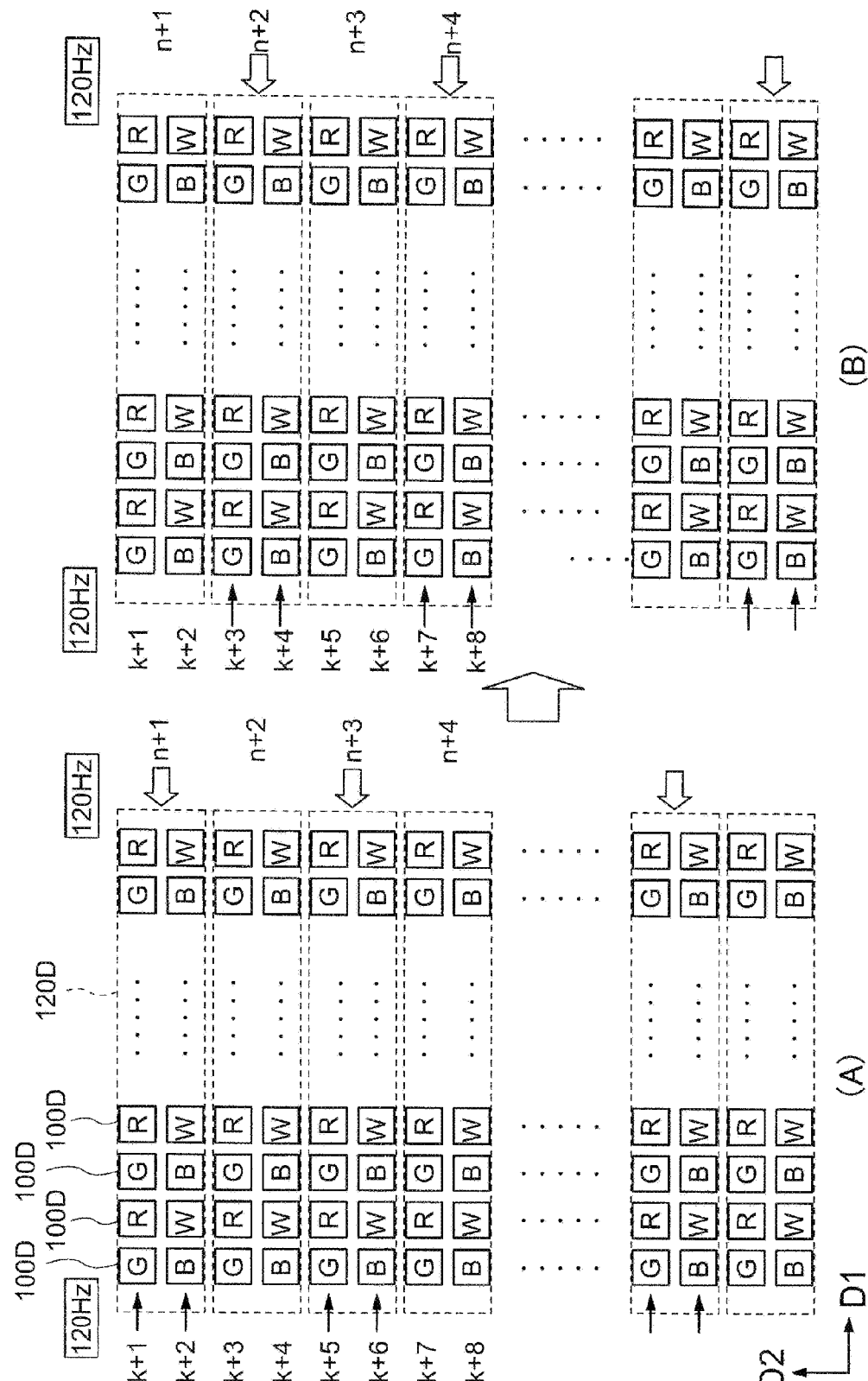
FIG. 14 shows an operation of a display device in an embodiment according to the present invention.
Figure 15:
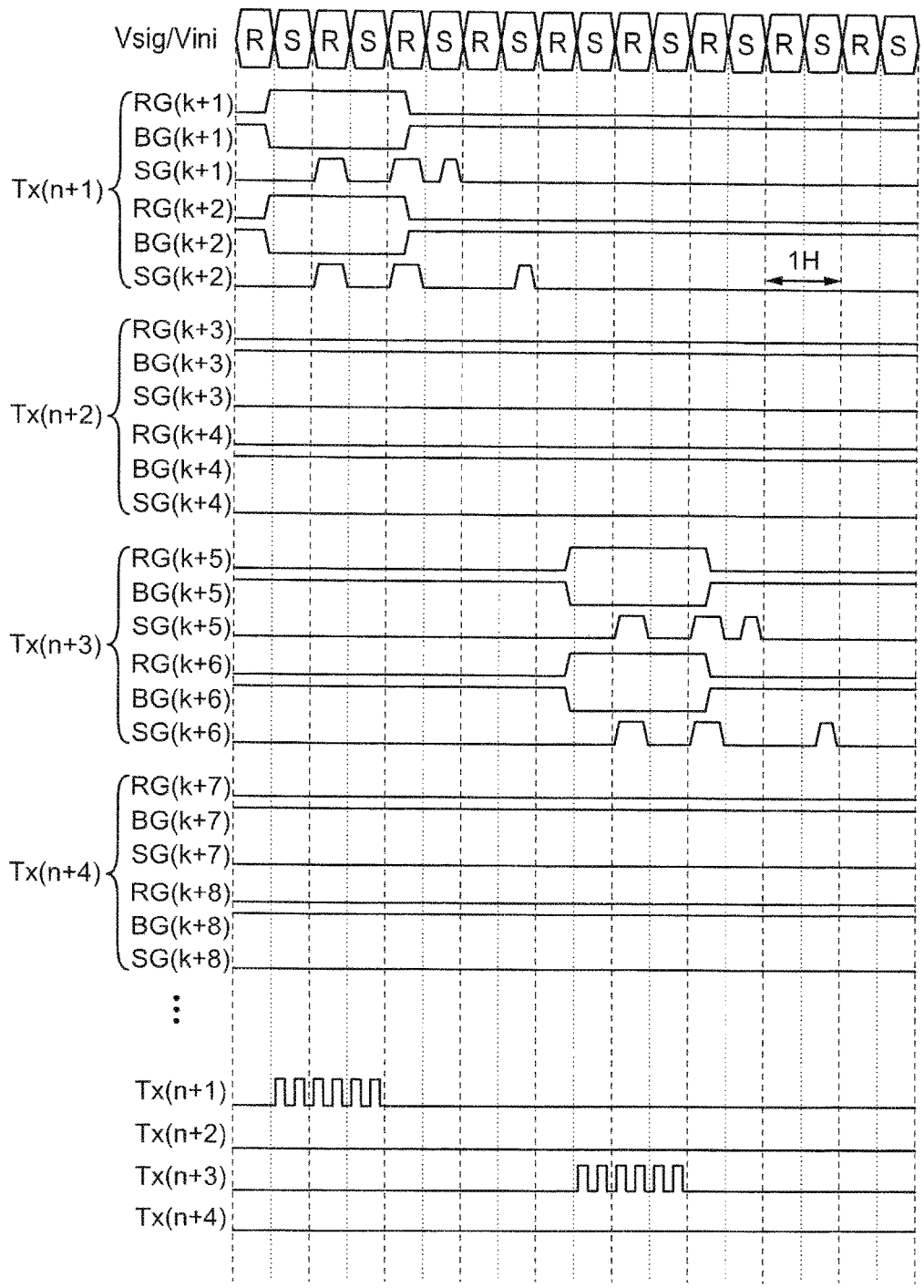
FIG. 15 is a timing diagram showing a method for driving a pixel circuit of the display device in an embodiment according to the present invention.
Figure 16:
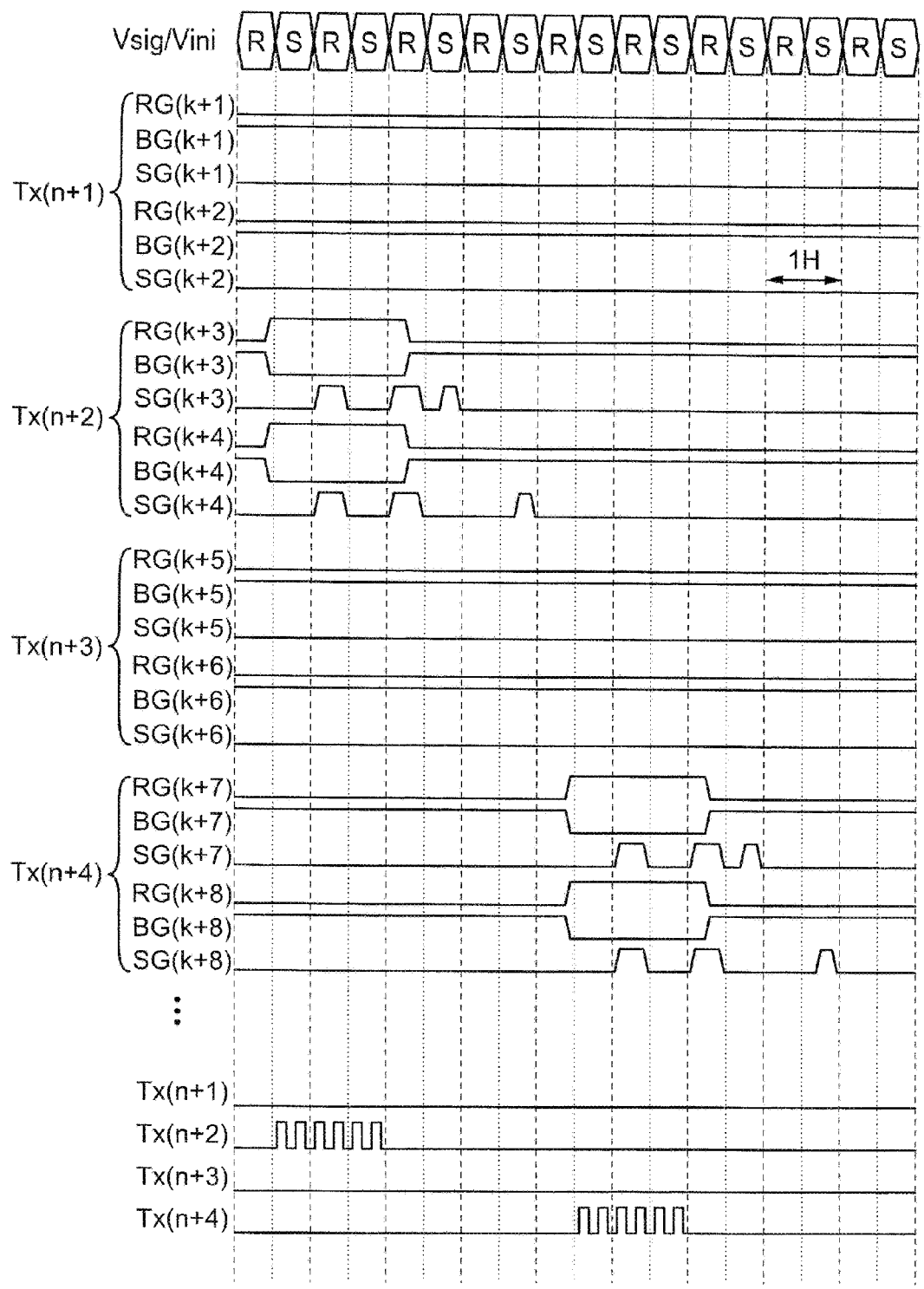
FIG. 16 is a timing diagram showing a method for driving the pixel circuit of the display device in an embodiment according to the present invention.

With reference to FIG. 14 through FIG. 16, an overview of a display device in an embodiment according to the present invention will be described. In embodiment 5, a display device 10D is driven by a method that is similar to the method for driving the display device 10A in embodiment 2. Unlike in the method for driving the display device 10A, in the method for driving the display device 10D, a video signal is written to a half number of sub pixels 100D in one frame period, and a video signal is written to another half number of sub pixels 100D in the next one frame period. Namely, the display device 10D performs interface driving. The cross-sectional structure and the circuit configuration of the display device 10D are substantially the same as those of the display device 10 in embodiment 1, and thus will not be described. The following embodiment is merely an example of the present invention.

FIG. 14 shows an operation of the display device 10D in an embodiment according to the present invention. In FIG. 14, a main pixel includes four sub pixels 100D arrayed in two rows by two columns. As described above, the main pixel is a minimum unit of sub pixels realizing a full-color display or a white display. The four sub pixels 100D respectively correspond to the RGBW (W is white) colors.

In FIG. 14, second electrodes 120D are each provided for every two rows of sub pixels 100D.

In other words, regarding the second direction D2, the second electrode 120D is provided for each main pixel. In this embodiment, the number of main pixels arrayed in the second direction D2 is equal to the number of second electrodes 120D arrayed in the second direction D2. Thus, a main pixel including the sub pixels 100D in the (k+1)th row and the (k+2)th row will be referred to as the "(n+1)th block main pixel", and a main pixel including the sub pixels 100D in the (k+3)th row and the (k+4)th row will be referred to as the "(n+2)th block main pixel". Namely, a plurality of blocks of main pixels are provided in the second direction D2.

In the frame shown in (A) in FIG. 14, the initialization period (a)-(b) and the writing period (c)-(d) are provided for the (k+1)th row pixel group and the (k+2)th row pixel group sharing the (n+1)th second electrode 120D and for the (k+5)th row pixel group and the (k+6)th row pixel group sharing the (n+3)th second electrode 120D. The light emission period (e) is provided for the (k+3)th row pixel group and the (k+4)th row pixel group sharing the (n+2)th second electrode 120D and for the (k+7)th row pixel group and the (k+8)th row pixel group sharing the (n+4)th second electrode 120D. In other words, the initialization period (a)-(b) and the writing period (c)-(d) are provided for odd numbered block main pixels, and the light emission period (e) is provided for even numbered block main pixels.

In this embodiment, in the frame shown in (A) in FIG. 14, in the initialization period (a)-(b) for the (k+1)th row pixel group and the (k+2)th row pixel group, the (n+1)th second electrode 120D is supplied with the touch sensor driving signal Tx(n+1). In the initialization period (a)-(b) for the (k+5)th row pixel group and the (k+6)th row pixel group, the (n+3)th second electrode 120D is supplied with the touch sensor driving signal Tx(n+3). In other words, the odd numbered block main pixels are provided with the touch sensor driving signals Tx(n+1) and Tx(n+3).

In the frame shown in (B) in FIG. 14, oppositely to the frame shown in (A) in FIG. 14, the light emission period (e) is provided for the (k+1)th row pixel group and the (k+2)th row pixel group sharing the (n+1)th second electrode 120D and for the (k+5)th row pixel group and the (k+6)th row pixel group sharing the (n+3)th second electrode 120D. The initialization period (a)-(b) and the writing period (c)-(d) are provided for the (k+3)th row pixel group and the (k+4)th row pixel group sharing the (n+2)th second electrode 120D and for the (k+7)th row pixel group and the (k+8)th row pixel group sharing the (n+4)th second electrode 120D. In other words, the initialization period (a)-(b) and the writing period (c)-(d) are provided for even numbered block main pixels, and the light emission period (e) is provided for odd numbered block main pixels.

In this embodiment, in the frame shown in (B) in FIG. 14, in the initialization period (a)-(b) for the (k+3)th row pixel group and the (k+4)th row pixel group, the (n+2)th second electrode 120D is supplied with the touch sensor driving signal Tx(n+2). In the initialization period (a)-(b) for the (k+7)th row pixel group and the (k+8)th row pixel group, the (n+4)th second electrode 120D is supplied with the touch sensor driving signal Tx(n+4). In other words, even numbered block main pixels are provided with the touch sensor driving signals Tx(n+2) and Tx(n+4).

Namely, in a first sub frame (half of one frame), among a plurality of row pixel groups including the plurality of sub pixels 100D arrayed in a matrix, a half number of row pixel groups are in the initialization period (a)-(b) and the writing period (c)-(d). The other half of row pixel groups are in the light emission period (e). The half number of row pixel groups that are in the initialization period (a)-(b) and the writing period (c)-(d) in the first sub frame are in the light emission period (e) in a second sub frame (half of one frame). The other half number of row pixel groups that are in the light emission period (e) in the first sub frame are in the initialization period (a)-(b) and the writing period (c)-(d) in the second sub frame. The display device 10D displays one frame of image by displaying an image of the first sub frame and an image of the second sub frame. One frame includes a first frame and a second sub frame.

With the interface driving in this embodiment, data write is performed on every two row pixel groups adjacent to each other in the second direction D2. The interlace driving is not limited to this. For example, data write may be performed on each three or more row pixel groups adjacent to each other in the second direction D2. In other words, three or more row pixel groups that belong to one half of the sub pixels, and three or more row pixel groups that belong to the other half of the sub pixels, may be located alternately.

As described above, data write and touch sensor driving are performed on the sub pixels 100D half by half in each frame. Therefore, in the case where one frame is driven by 60 Hz, the first sub frame and the second sub frame shown in (A) and (B) are each driven at 120 Hz.

FIG. 15 and FIG. 16 are each a timing diagram showing a method for driving a pixel circuit of the display device 10D in an embodiment according to the present invention. FIG. 15 shows the driving method in the frame shown in (A) in FIG. 14, and FIG. 16 shows the driving method in the frame shown in (B) in FIG. 14.

As shown in FIG. 15, the initialization period (a)-(b) and the writing period (c)-(d) are provided for the (k+1)th row pixel group and the (k+2)th row pixel group sharing the (n+1)th second electrode 120D. In the same time period as the initialization period (a)-(b) for the (k+1)th row pixel group and the (k+2)th row pixel group, the (n+1)th second electrode 120D is supplied with the touch sensor driving signal Tx(n+1). After this, the initialization period (a)-(b) and the writing period (c)-(d) are provided for the (k+5)th row pixel group and the (k+6)th row pixel group sharing the (n+3)th second electrode 120D. In the same time period as the initialization period (a)-(b) for the (k+5)th row pixel group and the (k+6)th row pixel group, the (n+3)th second electrode 120D is supplied with the touch sensor driving signal Tx(n+3). In these periods, the light emission period (e) is provided for the (k+3)th row pixel group and (k+4)th row pixel group sharing the (n+2)th second electrode 120D and for the (k+7)th row pixel group and (k+8)th row pixel group sharing the (n+4)th second electrode 120D.

As shown in FIG. 16, the initialization period (a)-(b) and the writing period (c)-(d) are provided for the (k+3)th row pixel group and the (k+4)th row pixel group sharing the (n+2)th second electrode 120D. In the same time period as the initialization period (a)-(b) for the (k+3)th row pixel group and the (k+4)th row pixel group, the (n+2)th second electrode 120D is supplied with the touch sensor driving signal Tx(n+2). After this, the initialization period (a)-(b) and the writing period (c)-(d) are provided for the (k+7)th row pixel group and the (k+8)th row pixel group sharing the (n+4)th second electrode 120D. In the same time period as the initialization period (a)-(b) for the (k+7)th row pixel group and the (k+8)th row pixel group, the (n+4)th second electrode 120D is supplied with the touch sensor driving signal Tx(n+4). In these periods, the light emission period (e) is provided for the (k+1)th row pixel group and (k+2)th row pixel group sharing the (n+1)th second electrode 120D and for the (k+5)th row pixel group and (k+6)th row pixel group sharing the (n+3)th second electrode 120D.

In this embodiment, the second electrode 120D is supplied with the touch sensor driving signal in the initialization period (a)-(b). The present invention is not limited to this method. The period in which the second electrode 120D is supplied with the touch sensor driving signal may be the writing period (d) or the light emission period (e).

As described above, according to the method for driving the display device 10D including the touch sensor in embodiment 5, even in the case where the touch sensor is driven at 120 Hz in order to remove noise, the timing at which scanning is performed for data write is matched to the timing at which the touch driving signal is supplied.

Figure 17:
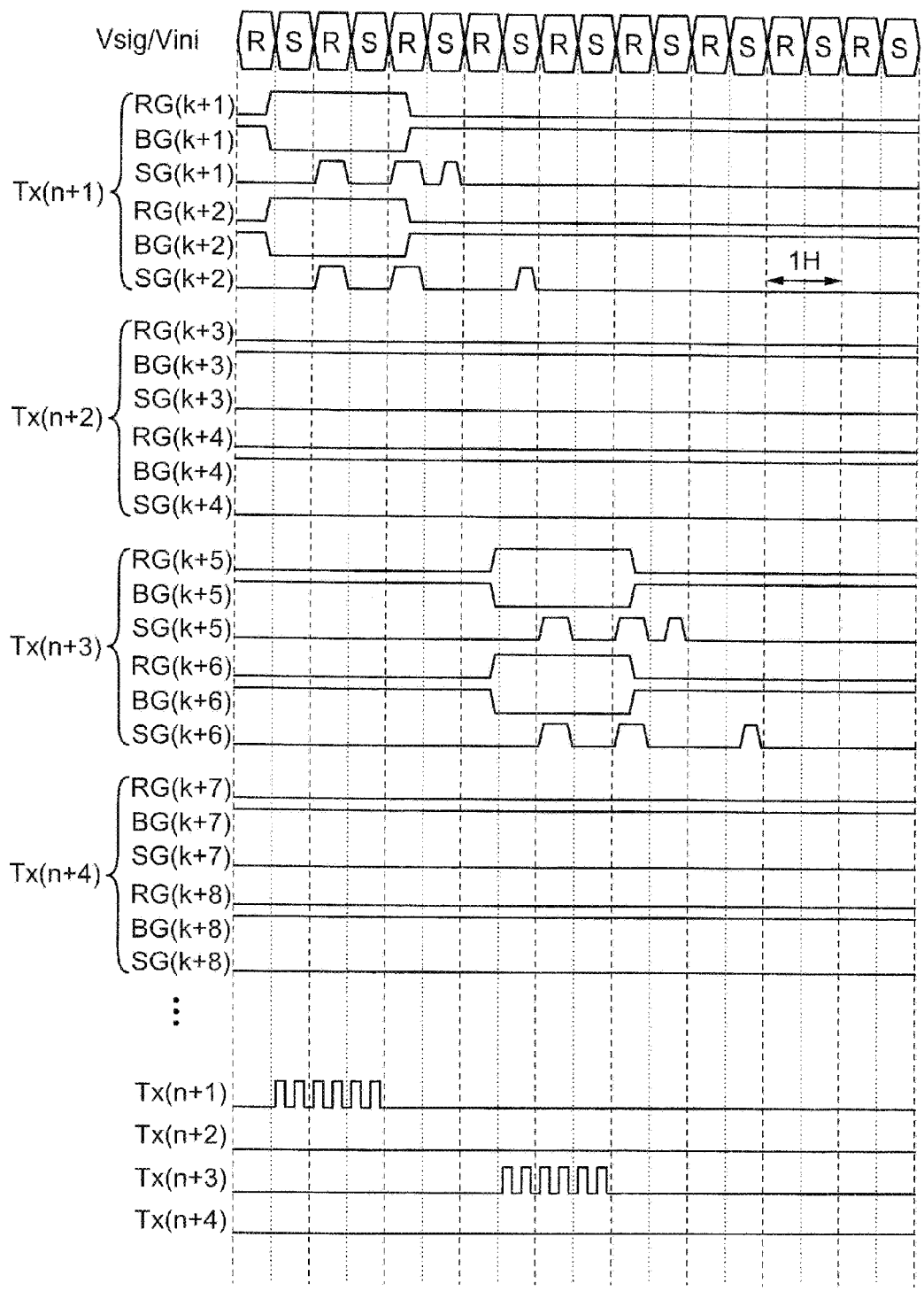
FIG. 17 is a timing diagram showing a method for driving the pixel circuit of the display device in an embodiment according to the present invention.

The method for driving the display device 10C in embodiment 4 may be applied to the method for driving the display device 10D in embodiment 5. More specifically, as shown in FIG. 17, during the writing period (c)-(d) for the (k+2)th row pixel group, the initialization period (a)-(b) for the (k+5)th row pixel group may be started.

Embodiment 6

Figure 18:
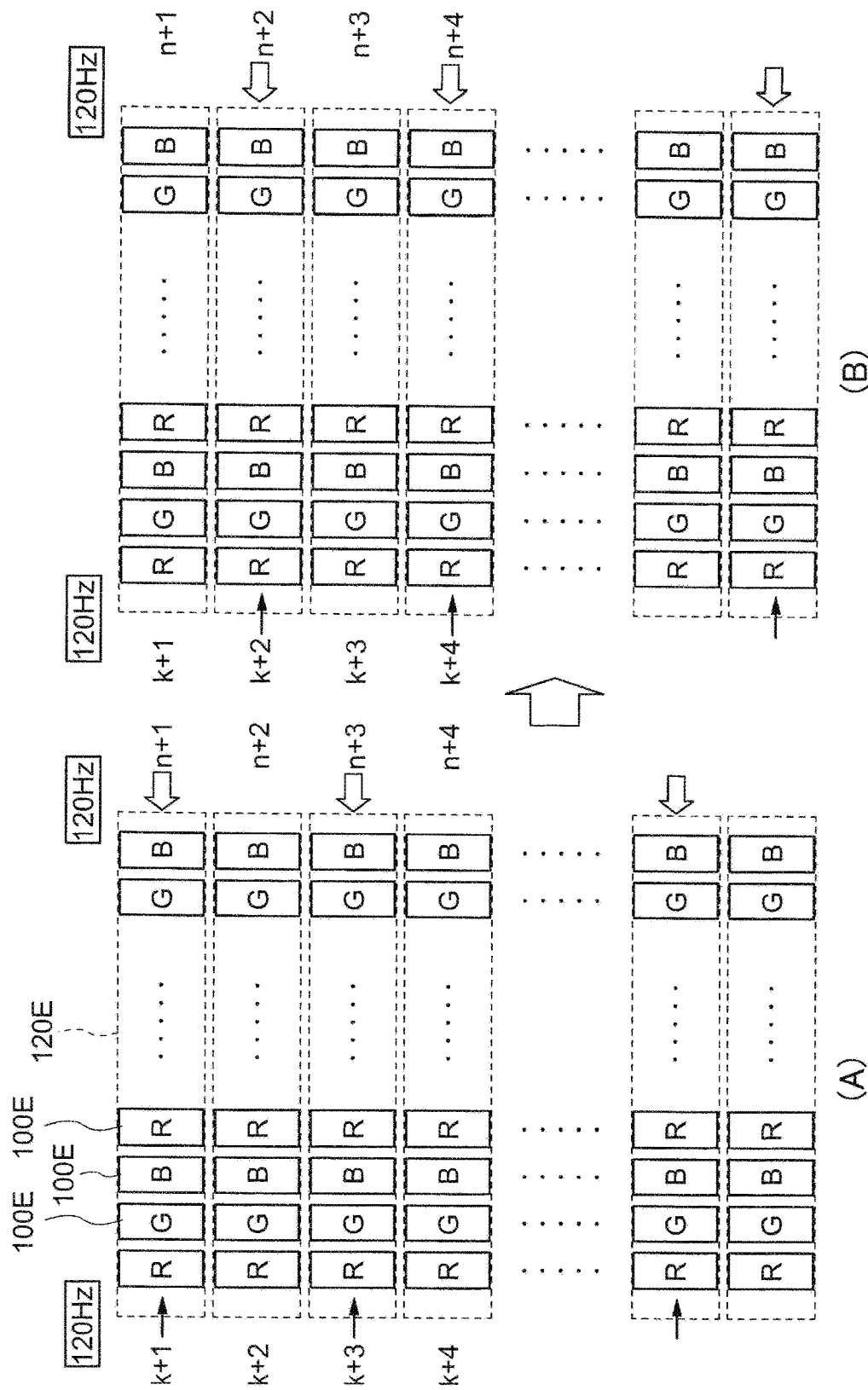
FIG. 18 shows an operation of a display device in an embodiment according to the present invention.
Figure 19:
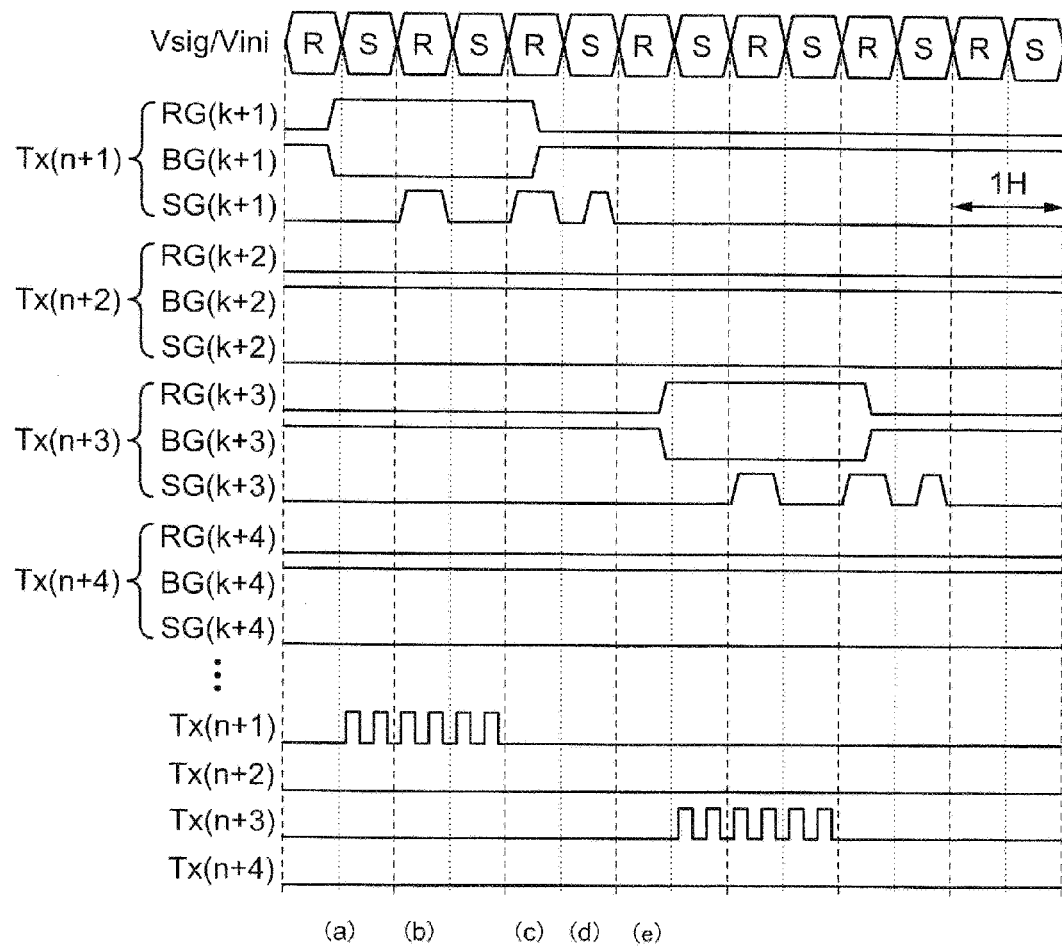
FIG. 19 is a timing diagram showing a method for driving a pixel circuit of the display device in an embodiment according to the present invention.
Figure 20:
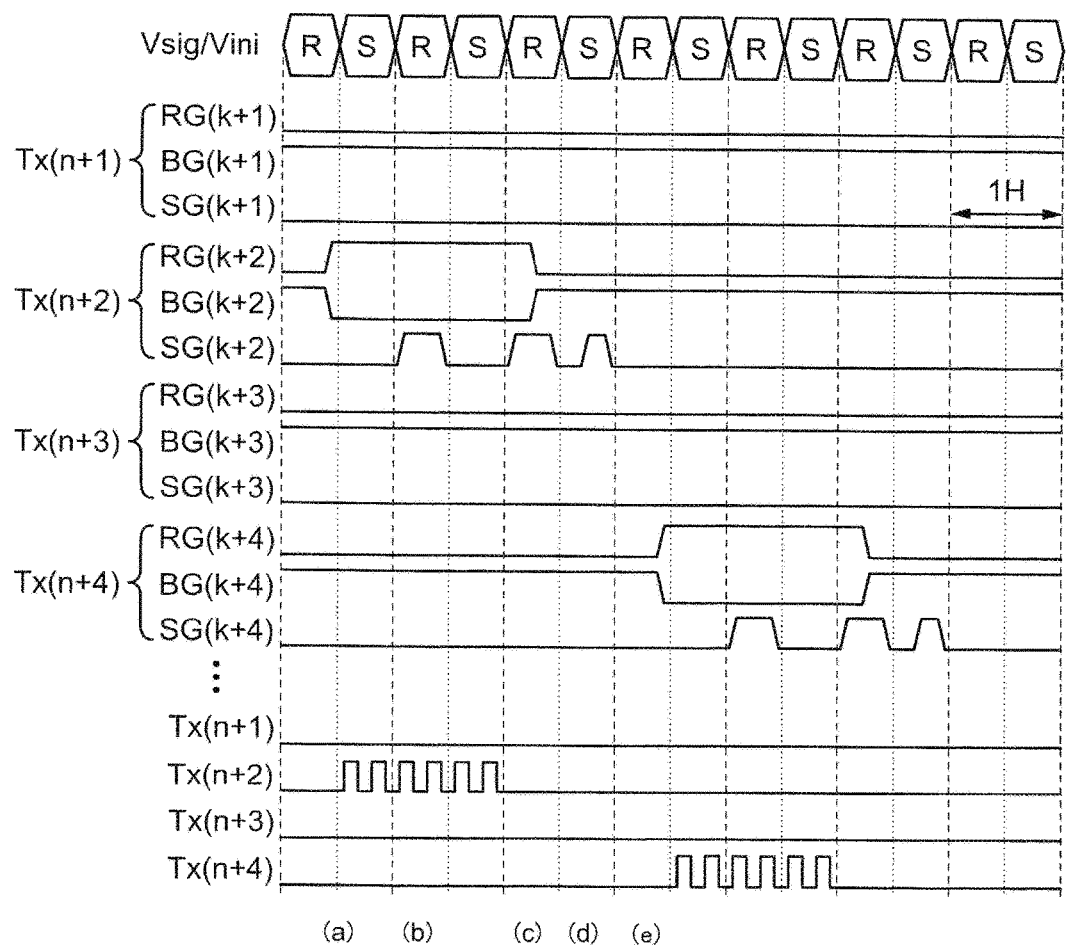
FIG. 20 is a timing diagram showing a method for driving the pixel circuit of the display device in an embodiment according to the present invention.

With reference to FIG. 18 through FIG. 20, an overview of a display device in an embodiment according to the present invention will be described. In embodiment 6, a display device 10E is driven by a method that is similar to the method for driving the display device 10D in embodiment 5. Unlike in the display device 10D, in the display device 10E, a main pixel includes three sub pixels 100E arrayed in one row by three columns. The three sub pixels 100E respectively correspond to the RGB colors. Like the display device 10D, the display device 10E performs interface driving. The cross-sectional structure and the circuit configuration of the display device 10E are substantially the same as those of the display device 10 in embodiment 1, and thus will not be described. The following embodiment is merely an example of the present invention.

FIG. 18 shows an operation of the display device 10E in an embodiment according to the present invention. In FIG. 18, second electrodes 120E are each provided for each row of sub pixels 100E.

In the frame shown in (A) in FIG. 18, the initialization period (a)-(b) and the writing period (c)-(d) are provided for the (k+1)th row pixel group sharing the (n+1)th second electrode 120E and for the (k+3)th row pixel group sharing the (n+3)th second electrode 120E. The light emission period (e) is provided for the (k+2)th row pixel group sharing the (n+2)th second electrode 120E and for the (k+4)th row pixel group sharing the (n+4)th second electrode 120E. In other words, the initialization period (a)-(b) and the writing period (c)-(d) are provided for the sub pixels 100E in odd numbered rows, and the light emission period (e) is provided for the sub pixels 100E in even numbered rows.

In this embodiment, in the frame shown in (A) in FIG. 18, in the initialization period (a)-(b) for the (k+1)th row pixel group, the (n+1)th second electrode 120E is supplied with the touch sensor driving signal Tx(n+1). In the initialization period (a)-(b) for the (k+3)th row pixel group, the (n+3)th second electrode 120E is supplied with the touch sensor driving signal Tx(n+3). In other words, the sub pixels 100E in odd numbered rows are provided with the touch sensor driving signals Tx(n+1) and Tx(n+3).

In the frame shown in (B) in FIG. 18, the light emission period (e) is provided for the (k+1)th row pixel group sharing the (n+1)th second electrode 120E and for the (k+3)th row pixel group sharing the (n+3)th second electrode 120E. The initialization period (a)-(b) and the writing period (c)-(d) are provided for the (k+2)th row pixel group sharing the (n+2)th second electrode 120E and for the (k+4)th row pixel group sharing the (n+4)th second electrode 120E. In other words, the initialization period (a)-(b) and the writing period (c)-(d) are provided for the sub pixels 100E in even numbered rows, and the light emission period (e) is provided for the sub pixels 100E in odd numbered rows.

In this embodiment, in the frame shown in (B) in FIG. 18, in the initialization period (a)-(b) for the (k+2)th pixel group, the (n+2)th second electrode 120E is supplied with the touch sensor driving signal Tx(n+2). In the initialization period (a)-(b) for the (k+4)th row pixel group, the (n+4)th second electrode 120E is supplied with the touch sensor driving signal Tx(n+4). In other words, the sub pixels 100E in even numbered rows are provided with the touch sensor driving signals Tx(n+2) and Tx(n+4).

FIG. 19 and FIG. 20 are each a timing diagram showing a method for driving a pixel circuit of the display device 10E in an embodiment according to the present invention. FIG. 19 shows the driving method in the frame shown in (A) in FIG. 19, and FIG. 20 shows the driving method in the frame shown in (B) in FIG. 18.

As shown in FIG. 19, the initialization period (a)-(b) and the writing period (c)-(d) are provided for the (k+1)th row pixel group sharing the (n+1)th second electrode 120E. In the same time period as the initialization period (a)-(b) for the (k+1)th row pixel group, the (n+1)th second electrode 120E is supplied with the touch sensor driving signal Tx(n+1). After this, the initialization period (a)-(b) and the writing period (c)-(d) are provided for the (k+3)th row pixel group sharing the (n+3)th second electrode 120E. In the same time period as the initialization period (a)-(b) for the (k+3)th row pixel group, the (n+3)th second electrode 120E is supplied with the touch sensor driving signal Tx(n+3). In these periods, the light emission period (e) is provided for the (k+2)th row pixel group sharing the (n+2)th second electrode 120E and for the (k+4)th row pixel group sharing the (n+4)th second electrode 120E.

As shown in FIG. 20, the initialization period (a)-(b) and the writing period (c)-(d) are provided for the (k+2)th row pixel group sharing the (n+2)th second electrode 120E. In the same time period as the initialization period (a)-(b) for the (k+2)th row pixel group, the (n+2)th second electrode 120E is supplied with the touch sensor driving signal Tx(n+2). After this, the initialization period (a)-(b) and the writing period (c)-(d) are provided for the (k+4)th row pixel group sharing the (n+4)th second electrode 120E. In the same time period as the initialization period (a)-(b) for the (k+4)th row pixel group, the (n+4)th second electrode 120E is supplied with the touch sensor driving signal Tx(n+4). In these periods, the light emission period (e) is provided for the (k+1)th row pixel group sharing the (n+1)th second electrode 120E and for the (k+3)th row pixel group sharing the (n+3)th second electrode 120E.

As described above, according to the method for driving the display device 10E including the touch sensor in embodiment 6, even in the case where the touch sensor is driven at 120 Hz in order to remove noise, the timing at which scanning is performed for data write is matched to the timing at which the touch driving signal is supplied.

Figure 21:
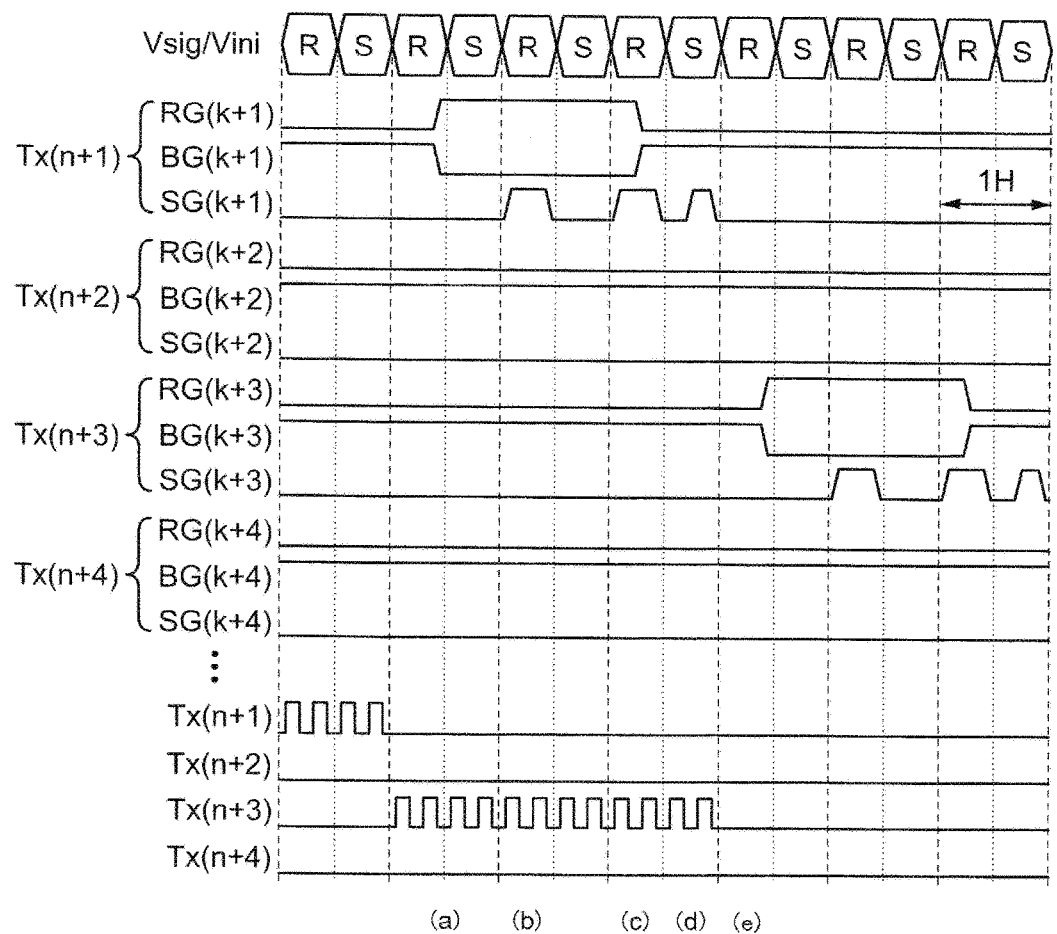
FIG. 21 is a timing diagram showing a method for driving the pixel circuit of the display device in an embodiment according to the present invention.

The method for driving the display device 10 in embodiment 1 may be applied to the method for driving the display device 10E in embodiment 6. More specifically, as shown in FIG. 21, immediately before the initialization (a)-(b) for the row pixels in the (k+3)th row, the (n+3)th second electrode 120E may be supplied with the touch sensor driving signal Tx(n+3).

Embodiment 7

Figure 22:
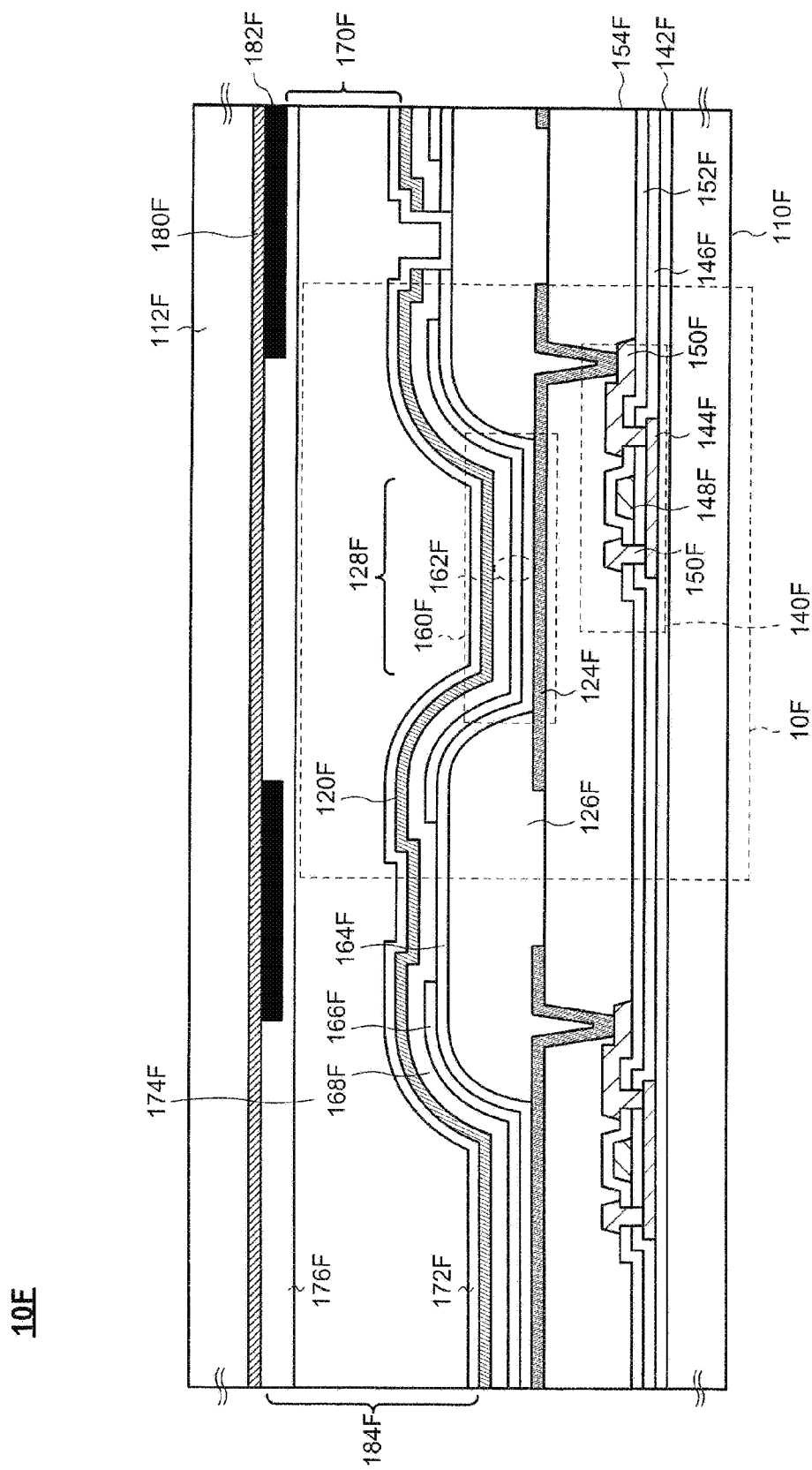
FIG. 22 is a cross-sectional view showing an overview of a display device in an embodiment according to the present invention.

With reference to FIG. 22, an overview of a display device in an embodiment according to the present invention will be described. FIG. 22 is a cross-sectional view showing a display device in an embodiment according to the present invention. A display device 10F in embodiment 7 has a cross-sectional structure similar to that of the display device 10 in embodiment 1. Unlike in the cross-sectional structure of the display device 10, in the cross-sectional structure of the display device 10F, a third electrode 180F is provided between a counter substrate 112F and a light shielding layer 182F. Except for this, the display device 10F is the same as the display device 10, and thus will not be described. The embodiment shown in FIG. 22 is merely an example of the present invention.

Embodiment 8

Figure 23:
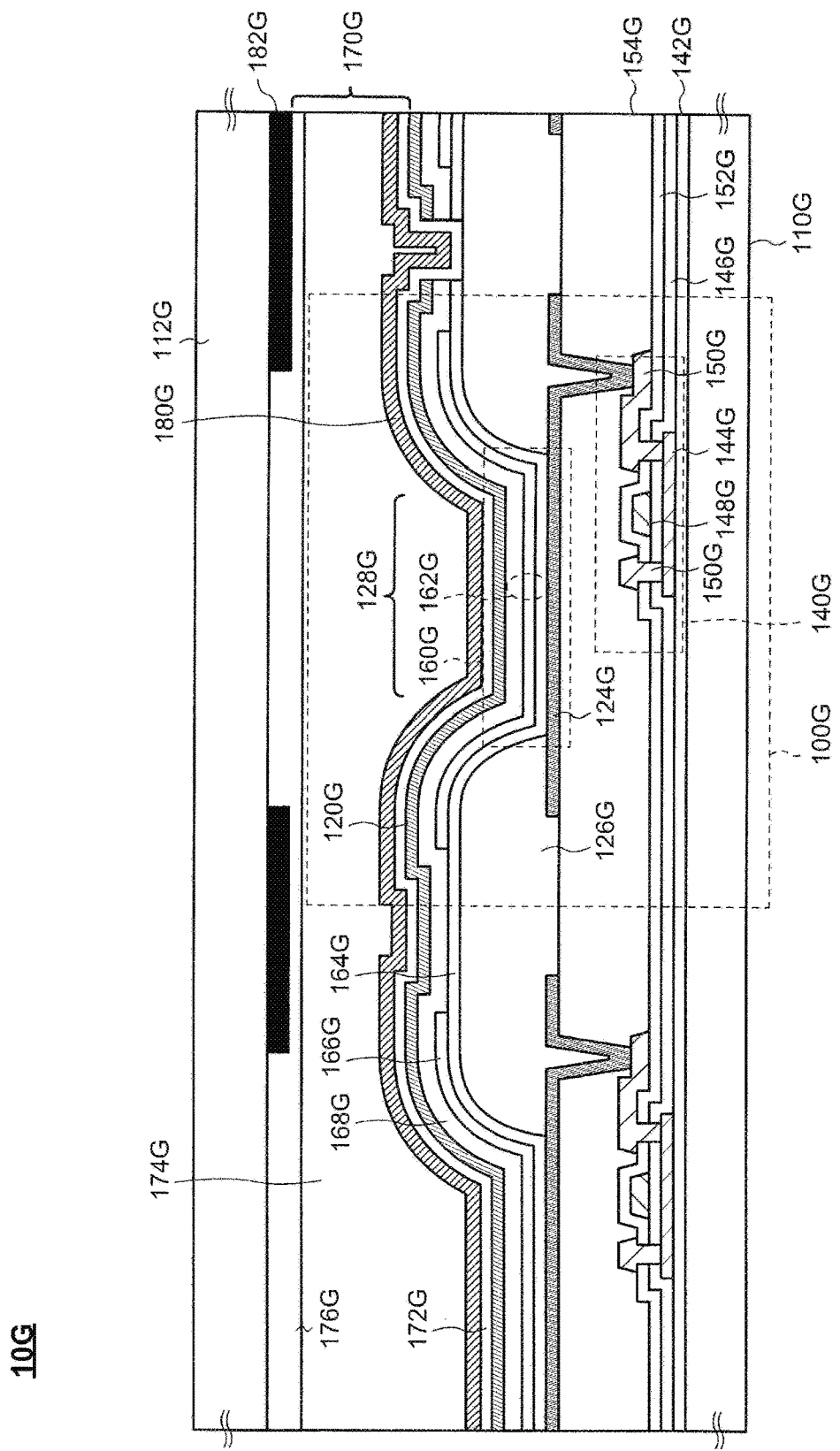
FIG. 23 is a cross-sectional view showing an overview of a display device in an embodiment according to the present invention.

With reference to FIG. 23, an overview of a display device in an embodiment according to the present invention will be described. FIG. 23 is a cross-sectional view showing a display device in an embodiment according to the present invention. A display device 10G in embodiment 8 has a cross-sectional structure similar to that of the display device 10 in embodiment 1. Unlike in the cross-sectional structure of the display device 10, in the cross-sectional structure of the display device 10G, a third electrode 180G is provided between a first insulating layer 172G and a second insulating layer 174G. Except for this, the display device 10G is the same as the display device 10, and thus will not be described. The embodiment shown in FIG. 23 is merely an example of the present invention.

As described above regarding the display device 10F in embodiment 7 and the display device 10G embodiment 8, the third electrode 180F and the third electrode 180G may be located at a position other than on the counter substrate 112F and the counter substrate 112G. Namely, the position of the third embodiment 180F or 180G may be appropriately set in relationship with a method for producing the display device 10F or 10G.

Embodiment 9

Figure 24:
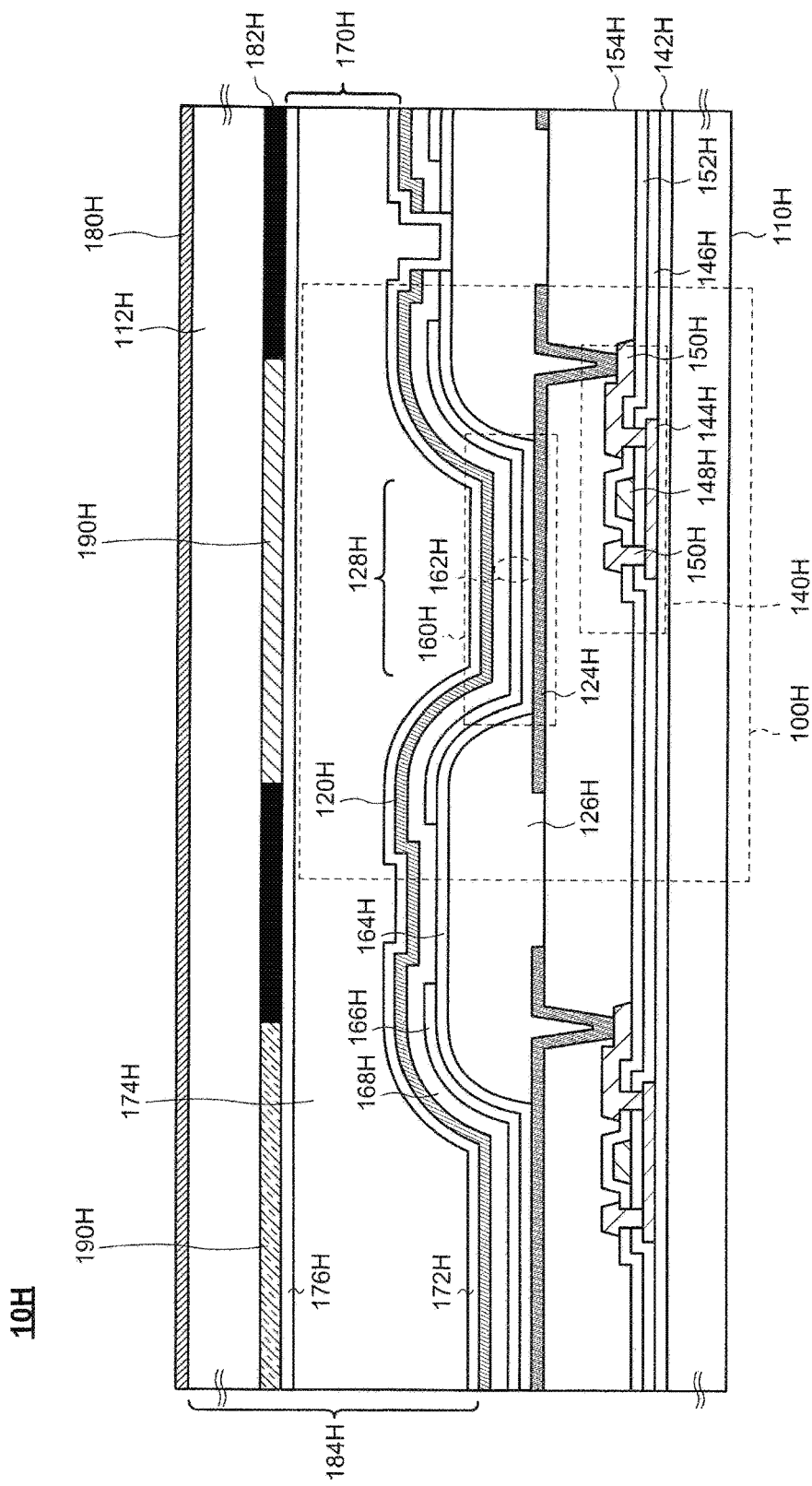
FIG. 24 is a cross-sectional view showing an overview of a display device in an embodiment according to the present invention.

With reference to FIG. 24, an overview of a display device in an embodiment according to the present invention will be described. FIG. 24 is a cross-sectional view showing a display device in an embodiment according to the present invention. A display device 10H in embodiment 9 has a cross-sectional structure similar to that of the display device 10 in embodiment 1. Unlike in the cross-sectional structure of the display device 10, in the cross-sectional structure of the display device 10H, a color filter 190H is provided between the counter substrate 112H and a light emitting element 160H, and the light emitting element 160H emit white light. Namely, the display device 10H is an organic EL display device in which white light emitted by the light emitting element is colored by the color filter. The embodiment shown in FIG. 24 is merely an example of the present invention.

In the display device 10H, sub pixels 100H emit white light. Therefore, an EL layer 162H in the light emitting element 160H may be commonly provided for the sub pixels 100H. Namely, it is not necessary to provide the EL layers 162H of different colors for the sub pixels 100H. The color filter 190H may be an RGB color filter or an RGBW color filter.

As described above, in the display device 10H including the touch sensor in embodiment 9, the EL layers 162H of different colors do not need to be provided for the sub pixels 100H. This simplifies the structure of the EL layer 162H. As a result, the production process of the display device 10H is shortened. In addition, a fault that may be caused by a step of providing different colors for the EL layers 162H is suppressed, and thus the yield is improved.

The present invention is not limited to any of the above-described embodiments, and may be appropriately altered without departing from the gist of the present invention.

What is claimed is:

1. A display device, comprising:
   a plurality of sub pixels;
   a plurality of first electrodes, the sub pixel having the plurality of first electrodes;
   a plurality of second electrodes, the second electrode being provided commonly for at least one row pixel group, the row pixel group including sub pixels arrayed in a line in a first direction among the plurality of sub pixels, the plurality of second electrodes being arrayed in a second direction crossing the first direction;
   a light emitting layer between the first electrode and the second electrode, the sub pixel having the light emitting layer;
   a plurality of third electrodes facing the second electrodes, the third electrodes and the second electrodes forming capacitances, the third electrodes being connected with a plurality of output terminals respectively; and
   a controller controlling a signal to be supplied to the first electrode and a signal to be supplied to the second electrode;
   wherein the controller:
      controls such that the row pixel groups are sequentially and repeatedly put into an initialization period, a writing period and a light emission period;
      controls such that the initialization period, the writing period and the light emission period provided for the row pixel group of a first row is subsequently provided for the row pixel group of a second row adjacent to the first row;
      supplies a second potential to the second electrodes for the row pixel groups in the initialization period and the writing period;
      supplies, after the second potential, a touch sensor driving signal to the second electrodes for the row pixel groups in the light emission period; and
      supplies the touch sensor driving signal to the second electrodes corresponding to the row pixel groups to be put into the initialization period next.

2. A display device, comprising:
   a plurality of sub pixels;
   a plurality of first electrodes, the sub pixel having the plurality of first electrodes;
   a plurality of second electrodes, the second electrode being provided commonly for at least one row pixel group, the row pixel group including sub pixels arrayed in a line in a first direction among the plurality of sub pixels, the plurality of second electrodes being arrayed in a second direction crossing the first direction;
   a light emitting layer between the first electrode and the second electrode, the sub pixel having the light emitting layer;

a plurality of third electrodes facing the second electrodes, the third electrodes and the second electrodes forming capacitances, the third electrodes being connected with a plurality of output terminals respectively; and a controller controlling a signal to be supplied to the first electrode and a signal to be supplied to the second electrode;

wherein the controller:
controls such that the row pixel groups are sequentially and repeatedly put into an initialization period, a writing period and a light emission period;

controls such that the initialization period, the writing period and the light emission period provided for the row pixel group of a first row is subsequently provided for the row pixel group of a second row adjacent to the first row;

supplies a second potential to the second electrodes for the row pixel groups in the writing period and the light emission period; and supplies the touch sensor driving signal to the second electrodes for the row pixel groups in the initialization period;

the second electrodes are provided commonly for m row pixel group(s) (m is an integer of 1 or greater) adjacent to each other in the second direction; and the m row pixel group(s) sharing second electrode are in the initialization period concurrently.

3. The display device according to claim 2, wherein in the writing period after the initialization period for the m row pixel group(s) sharing the second electrode, the controller sequentially supplies the video signal to the m row pixel group(s) sharing the second electrode in the order of a first row, a second row, . . . and an m'th row.

4. The display device according to claim 3, wherein:
the plurality of second electrodes are arrayed in the second direction; and
during the writing period for the m row pixel group(s) sharing one of a pair of the second electrodes adjacent to each other, the controller starts the initialization period for the m row pixel group(s) sharing the other of the pair of the second electrodes.

5. The display device according to claim 3, wherein:
the plurality of second electrodes are arrayed in the second direction; and
in the initialization period for the m row pixel group(s) sharing one of a pair of the second electrodes adjacent to each other, the controller provides the writing period for the m row pixel group(s) sharing the other of the pair of the second electrodes.

6. A display device, comprising:
a plurality of sub pixels;
a plurality of first electrodes, the sub pixel having the plurality of first electrodes;
a plurality of second electrodes, the second electrode being provided commonly for at least one row pixel group, the row pixel group including sub pixels arrayed in a line in a first direction among the plurality of sub pixels, the plurality of second electrodes being arrayed in a second direction crossing the first direction;
a light emitting layer between the first electrode and the second electrode, the sub pixel having the light emitting layer;

a plurality of third electrodes facing the second electrodes, the third electrodes and the second electrodes forming capacitances, the third electrodes being connected with a plurality of output terminals respectively; and a controller controlling a signal to be supplied to the first electrode and a signal to be supplied to the second electrode;

wherein the sub pixel includes a driving transistor, a pixel selection transistor, and a capacitance element, and the controller:
controls such that the row pixel groups are sequentially and repeatedly put into:
an initialization period in which a potential of at least one of the source electrode, the drain electrode and the gate electrode of the driving transistor is initialized;
a writing period in which a charge in accordance with a video signal supplied to the gate electrode of the driving transistor via the source line is stored on the capacitance element; and
a light emission period in which the light emitting layer emits light at a light emission intensity in accordance with the video signal; and
controls such that the initialization period, the writing period and the light emission period provided for the row pixel group of a first row is subsequently provided for the row pixel group of a second row adjacent to the first row;
alternately repeats:
a first sub frame in which, among the row pixel groups including the plurality of sub pixels, one half of the row pixel groups are in the initialization period and the writing period, and the other half of the row pixel groups are in the light emission period; and
a second sub frame in which the one half of the row pixel groups are in the light emission period, and the other half of the row pixel groups are in the initialization period and the writing period; and
supplies the touch sensor driving signal for the touch sensor to the second electrode for the row pixel groups in at least one of the initialization period, the writing period and the light emission period.

7. The display device according to claim 6, wherein:
main pixels are provided in a plurality of blocks arrayed in the second direction, the main pixels being a minimum unit of the sub pixels displaying a white color among the plurality of sub pixels;
the one half of the row pixel groups are included in the main pixels of odd numbered blocks of the plurality of blocks; and
the other half of the row pixel groups are included in the main pixels of even numbered blocks of the plurality of blocks.

8. The display device according to claim 6, wherein:
the one half of the row pixel groups and the other half of the row pixel groups are provided alternately;
the second electrodes are provided commonly for the plurality of row pixel groups adjacent to each other in the second direction; and
the plurality of second electrodes adjacent to each other have a slit therebetween.

* * * * *